(12) United States Patent
Kita

(10) Patent No.: US 12,444,533 B2
(45) Date of Patent: Oct. 14, 2025

(54) HIGH-FREQUENCY MODULE AND COMMUNICATION APPARATUS

(71) Applicant: Murata Manufacturing Co., Ltd., Kyoto (JP)

(72) Inventor: Terumichi Kita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 835 days.

(21) Appl. No.: 17/660,032

(22) Filed: Apr. 21, 2022

(65) Prior Publication Data

US 2022/0246345 A1    Aug. 4, 2022

Related U.S. Application Data

(63) Continuation of application No. PCT/JP2020/040407, filed on Oct. 28, 2020.

(30) Foreign Application Priority Data

Dec. 20, 2019 (JP) .................. 2019-230972

(51) Int. Cl.
| | |
|---|---|
| H01F 27/28 | (2006.01) |
| H01F 38/14 | (2006.01) |
| H03F 1/26 | (2006.01) |

(52) U.S. Cl.
CPC ......... H01F 27/2885 (2013.01); H01F 38/14 (2013.01); H03F 1/26 (2013.01); *H03F 2200/294* (2013.01)

(58) Field of Classification Search
None
See application file for complete search history.

(56) References Cited

U.S. PATENT DOCUMENTS 8,093,983 B2 *  1/2012  Fouquet ............ H03H 7/52
                                           257/E23.079
8,849,362 B1    9/2014  Saji et al.
(Continued)

FOREIGN PATENT DOCUMENTS

| JP | 2015-111802 A | 6/2015 |
| JP | 2015-111803 A | 6/2015 |

(Continued)

OTHER PUBLICATIONS

International Search Report for International Patent Application No. PCT/JP2020/040407 dated Jan. 12, 2021.

*Primary Examiner* — Timothy J Thompson
*Assistant Examiner* — John B Freal
(74) *Attorney, Agent, or Firm* — McDonald Hopkins LLC

(57) ABSTRACT

Coupling between inductors is restrained, and the layout area of a substrate is also ensured. A high-frequency module includes a mounting substrate, a first inductor, a second inductor, at least one high-frequency component, a shield layer, and a conductive member. The mounting substrate has a main surface. The first inductor is located on a main surface side of the mounting substrate. The second inductor is located on the main surface side of the mounting substrate. The high-frequency component is located on the main surface side of the mounting substrate and between the first inductor and the second inductor. The shield layer is connected to the ground. The conductive member connects the high-frequency component and the shield layer. The conductive member is connected to a main surface of the high-frequency component, the main surface facing the shield layer.

18 Claims, 12 Drawing Sheets

(56) References Cited

U.S. PATENT DOCUMENTS

| | | | |
|---|---|---|---|
| 2002/0154592 A1* | 10/2002 | Tanaka | H03B 5/1203 |
| 2008/0014678 A1* | 1/2008 | Howard | H01L 23/552 |
| | | | 438/106 |
| 2016/0086926 A1* | 3/2016 | Pratt | H01L 23/49811 |
| | | | 257/774 |
| 2019/0199095 A1 | 6/2019 | Kim et al. | |
| 2019/0220722 A1 | 7/2019 | Matsubara | |
| 2020/0228073 A1 | 7/2020 | Naniwa | |

FOREIGN PATENT DOCUMENTS

| | | |
|---|---|---|
| WO | 2018/043862 A1 | 3/2018 |
| WO | 2018/062119 A1 | 4/2018 |
| WO | 2019/065419 A1 | 4/2019 |

\* cited by examiner

HIGH-FREQUENCY MODULE AND COMMUNICATION APPARATUS

CROSS REFERENCE TO RELATED APPLICATION

This is a continuation of International Application No. PCT/JP2020/040407 filed on Oct. 28, 2020 which claims priority from Japanese Patent Application No. 2019-230972 filed on Dec. 20, 2019. The contents of these applications are incorporated herein by reference in their entireties.

BACKGROUND OF THE DISCLOSURE

Field of the Disclosure

The present disclosure typically relates to a high-frequency module and a communication apparatus and in more detail relates to a high-frequency module including a plurality of inductors and a communication apparatus including the high-frequency module.

Description of the Related Art

To date, a front-end module (high-frequency module) including a substrate, a filter portion (high-frequency component) provided to the substrate, and a plurality of inductors provided to the substrate is known (for example, see Patent Document 1). In the front-end module described in Patent Document 1, a filter portion and a plurality of inductors are provided to a main surface serving as one of surfaces of a substrate.

Patent Document 1: International Publication No. 2018/043862

BRIEF SUMMARY OF THE DISCLOSURE

In the technical field of a high-frequency module, there is a desire for restraining coupling between inductors and also ensuring a substrate layout area.

It is a possible benefit of the present disclosure to provide a high-frequency module and a communication apparatus that enable coupling between inductors to be restrained and also a substrate layout area to be ensured.

A high-frequency module according to an aspect of the present disclosure includes a mounting substrate, a first inductor, a second inductor, at least one high-frequency component, a shield layer, and a conductive member. The mounting substrate has a main surface. The first inductor is located on a main surface side of the mounting substrate. The second inductor is located on the main surface side of the mounting substrate. The high-frequency component is located on the main surface side of the mounting substrate and between the first inductor and the second inductor. The shield layer is connected to the ground. The conductive member connects the high-frequency component and the shield layer. The conductive member is connected to a main surface of the high-frequency component, the main surface facing the shield layer.

A communication apparatus according to an aspect of the present disclosure includes the high-frequency module and a signal processing circuit. The signal processing circuit processes a reception signal from an antenna and a transmission signal to the antenna.

With the high-frequency module and the communication apparatus according to the aspects of the present disclosure, coupling between the inductors may be restrained, and a substrate layout area may also be ensured.

DETAILED DESCRIPTION OF THE DISCLOSURE

Hereinafter, a high-frequency module and a communication apparatus according to Embodiments 1 and 2 will be described with reference to the drawings. FIGS. 2A to 12B referenced in the following embodiments and the like are each a schematic view, and the size, the depth, and the ratio of the size, and the depth of each component do not necessarily reflect an actual scale ratio. In addition, in FIGS. 2B, 3B, 7, 8, 11, and 12B, the illustration of any bump is omitted.

Embodiment 1

(1) High-Frequency Module

The configuration of a high-frequency module 1 according to Embodiment 1 will be described with reference to the drawings.

Figure 1:
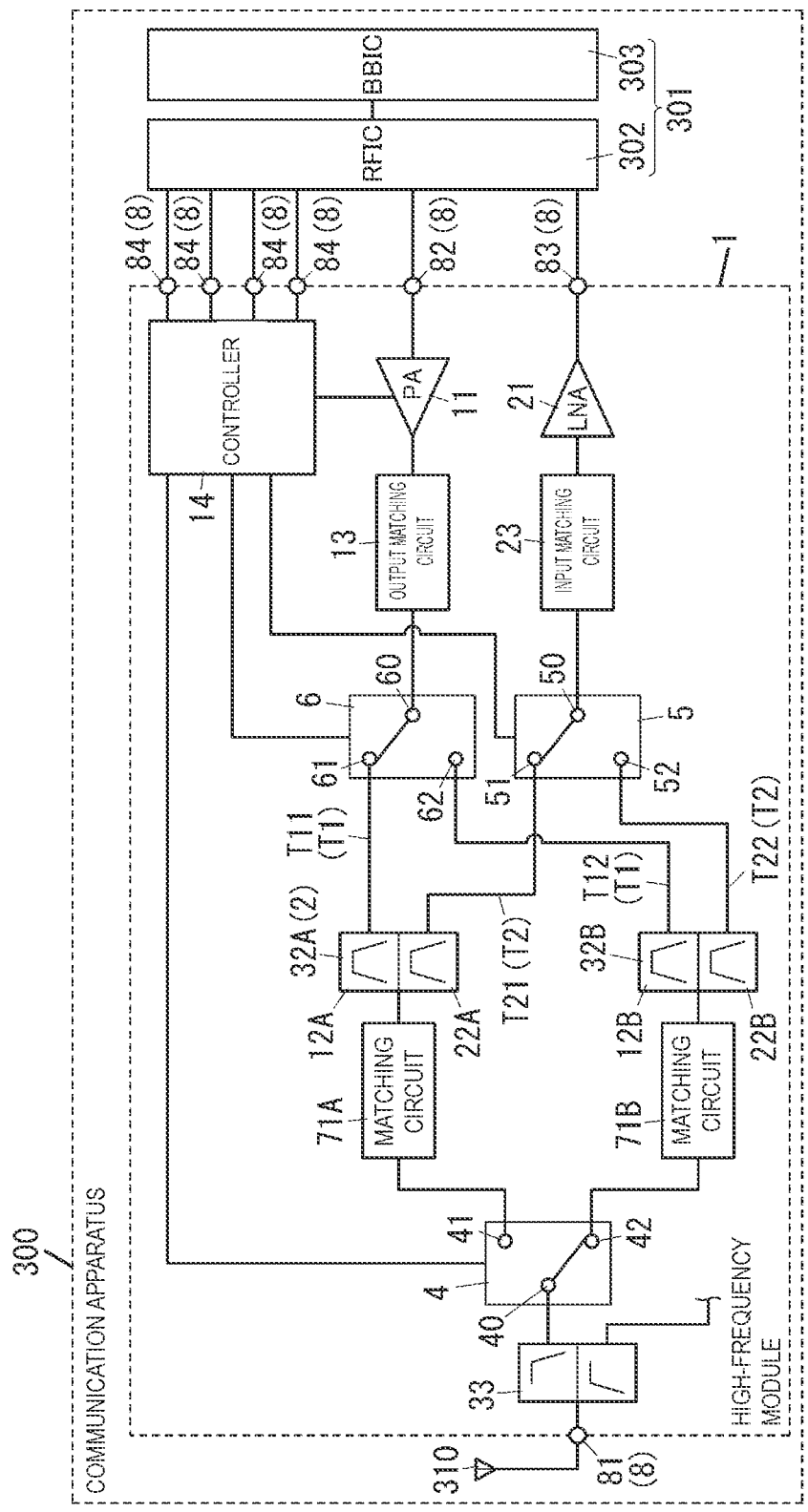
FIG. 1 is a circuit diagram of a communication apparatus including a high-frequency module according to Embodiment 1.

As illustrated in FIG. 1, the high-frequency module 1 according to Embodiment 1 includes a power amplifier 11 and a low-noise amplifier 21. The high-frequency module 1 includes a plurality of (two, in the illustrated example)

duplexers 32A and 32B and a filter 33. The duplexer 32A includes a transmission filter 12A and a reception filter 22A. The duplexer 32B includes a transmission filter 12B and a reception filter 22B.

Figure 2A:
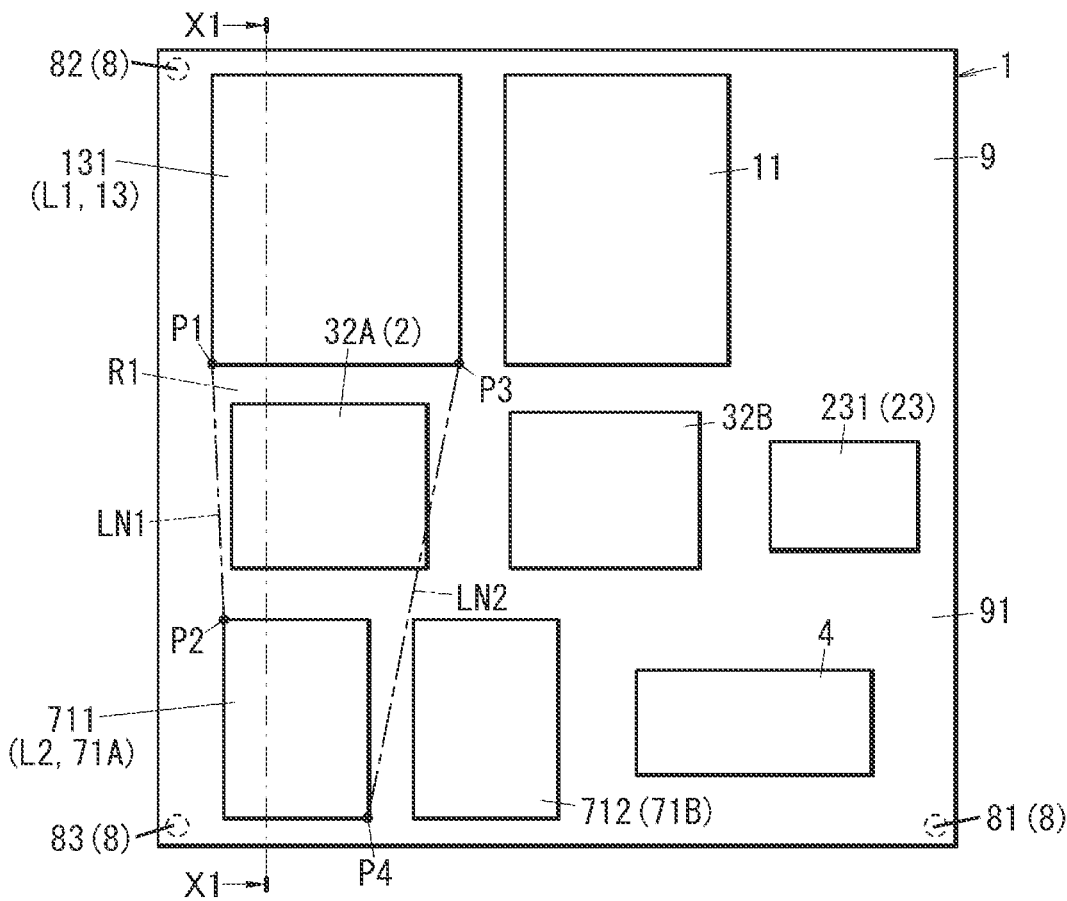
FIG. 2A is a plan view of the high-frequency module.
Figure 2B:
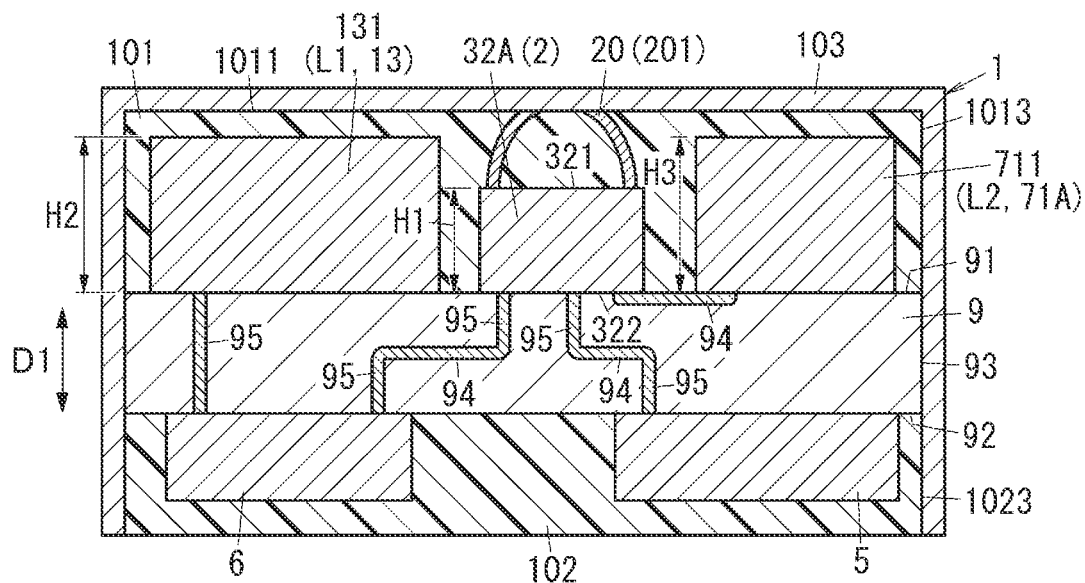
FIG. 2B is a cross-sectional view taken along the X1-X1 line in FIG. 2A.

Further, the high-frequency module 1 includes an output matching circuit 13, an input matching circuit 23, and a plurality of (two, in the illustrated example) matching circuits 71A and 71B. The high-frequency module 1 also includes a first switch 4, a second switch 5, a third switch 6, and a plurality of external connection terminals 8. As illustrated in FIGS. 2A and 2B, the high-frequency module 1 also includes a mounting substrate 9, a first resin layer 101, a second resin layer 102, a shield layer 103, and a conductive member 20.

Note that, in the following description, in a case where the duplexers 32A and 32B do not need to be particularly discriminated, each of the duplexers 32A and 32B is also referred to as "a duplexer 32". In addition, in a case where transmission filters 12A and 12B do not need to be particularly discriminated, each of the transmission filters 12A and 12B is also referred to as "a transmission filter 12". Further, in a case where reception filters 22A and 22B do not need to be particularly discriminated, each of the reception filters 22A and 22B is also referred to as "a reception filter 22". In addition, in a case where the matching circuits 71A and 71B do not need to be particularly discriminated, each of the matching circuits 71A and 71B is also referred to as "a matching circuit 71".

As illustrated in FIG. 1, the high-frequency module 1 is used for, for example, a communication apparatus 300. The communication apparatus 300 is, for example, a cellular phone such as a smartphone. Note that the communication apparatus 300 is not limited to the cellular phone and may be, for example, a wearable terminal such as a smart watch. The high-frequency module 1 is, for example, a module that can support a fourth-generation mobile communication (4G) standard, a fifth-generation mobile communication (5G) standard, and the like. The 4G standard is, for example, the 3GPP long term evolution (LTE) standard. The 5G standard is, for example, the 5G new radio (NR). The high-frequency module 1 is a module that can support carrier aggregation and dual connectivity. That is, the high-frequency module 1 is a module that can support communications simultaneously performed.

The high-frequency module 1 performs communication in a plurality of communication bands. In more detail, the high-frequency module 1 transmits a transmission signal in each of the plurality of communication bands and receives a reception signal in each of the plurality of communication bands. Specifically, the high-frequency module 1 performs communication in a first communication band and communication in a second communication band. In more detail, the high-frequency module 1 transmits a transmission signal in the first communication band and receives a reception signal in the first communication band. In addition, the high-frequency module 1 transmits a transmission signal in the second communication band and receives a reception signal in the second communication band.

The high-frequency module 1 has a plurality of (two, in the illustrated example) transmission paths T1 to transmit transmission signals in the plurality of communication bands. The plurality of transmission paths T1 include a first transmission path T11 and a second transmission path T12. A first transmission signal in the first communication band passes through the first transmission path T11, and a second transmission signal in the second communication band passes through the second transmission path T12.

The high-frequency module 1 has a plurality of (two, in the illustrated example) reception paths T2 to receive reception signals in the plurality of communication bands. The plurality of reception paths T2 include a first reception path T21 and a second reception path T22. A first reception signal in the first communication band passes through the first reception path T21, and a second reception signal in the second communication band passes through the second reception path T22.

The transmission signals and the reception signals are, for example, frequency division duplex (FDD) signals. The FDD is a radio communication technology by which transmission and reception are performed in radio communication in such a manner as to be assigned respective different frequency bands. Note that the transmission signals and the reception signals are not limited to the FDD signals and may be time division duplex (TDD) signals. The TDD is a radio communication technology by which the transmission and the reception in the radio communication are assigned the same frequency band and are changed over based on time.

(2) High-Frequency Module Circuit Configuration

Hereinafter, the circuit configuration of the high-frequency module 1 according to Embodiment 1 will be described with reference to the drawings. A case where the transmission signals and the reception signals are FDD signals will herein be described.

(2.1) Power Amplifier

The power amplifier 11 illustrated in FIG. 1 is an amplifier that amplifies the amplitude of a transmission signal. The power amplifier 11 is disposed between the input terminal 82 and the output matching circuit 13 on one of the transmission paths T1 that connects an antenna terminal 81 (described later) and an input terminal 82 (described later). The power amplifier 11 is connected to an external circuit (for example, a signal processing circuit 301) with the input terminal 82 interposed therebetween. The power amplifier 11 is also connected to the output matching circuit 13. The power amplifier 11 is controlled, for example, by a controller 14.

(2.2) Low-Noise Amplifier

The low-noise amplifier 21 illustrated in FIG. 1 is an amplifier that amplifies the amplitude of a reception signal with low noise. The low-noise amplifier 21 is disposed between the input matching circuit 23 and the output terminal 83 on one of the reception paths T2 that connects the antenna terminal 81 and an output terminal 83 (described later). The low-noise amplifier 21 is connected to the external circuit (for example, the signal processing circuit 301) with the output terminal 83 interposed therebetween. The low-noise amplifier 21 is also connected to the input matching circuit 23. The low-noise amplifier 21 is controlled, for example, by the signal processing circuit 301 (described later).

(2.3) Transmission Filters

The transmission filters 12A and 12B illustrated in FIG. 1 are each a transmission filter for a communication band for which a transmission signal is allowed to pass. The transmission filters 12A and 12B are each disposed between the output matching circuit 13 and the antenna terminal 81 on a corresponding one of the transmission paths T1. In more detail, the transmission filter 12A is disposed on the first transmission path T11, and the transmission filter 12B is disposed on the second transmission path T12. The transmission filters 12A and 12B allow to pass transmission signals in the respective transmission bands in the aforementioned communication band among high-frequency signals amplified by the power amplifier 11.

(2.4) Reception Filters

The reception filters 22A and 22B illustrated in FIG. 1 are each a reception filter for a communication band for which a reception signal is allowed to pass. The reception filters 22A and 22B are each disposed between the antenna terminal 81 and the input matching circuit 23 on a corresponding one of the reception paths T2. In more detail, the reception filter 22A is disposed on the first reception path T21, and the reception filter 22B is disposed on the second reception path T22. The reception filters 22A and 22B each allow to pass reception signals in the respective reception bands in the aforementioned communication band among high-frequency signals inputted from the antenna terminal 81.

(2.5) Filter

The filter 33 illustrated in FIG. 1 is disposed on the output side of the plurality of transmission filters 12 and on the input side of the plurality of reception filters 22 and allows the transmission signals (the first transmission signal and the second transmission signal) and the reception signals (the first reception signal and the second reception signal) to pass therethrough. In more detail, the filter 33 is disposed between the antenna terminal 81 and the first switch 4. The filter 33 includes, for example, a plurality of inductors (not illustrated) and a capacitor (not illustrated). The filter 33 may be an integrated passive device (IPD) including the plurality of inductors and the capacitor. Note that the filter 33 is included in a diplexer.

(2.6) Output Matching Circuit

As illustrated in FIG. 1, the output matching circuit 13 is disposed between the power amplifier 11 and each of the transmission filters 12A and 12B on a corresponding one of the transmission paths T1. The output matching circuit 13 is a circuit for performing impedance matching between the power amplifier 11 and each of the transmission filters 12A and 12B.

The output matching circuit 13 includes, for example, a plurality of inductors (not illustrated) and a plurality of capacitors (not illustrated). Note that the configuration of the output matching circuit 13 is not limited to the configuration in which the plurality of inductors and the plurality of capacitors are included and may be, for example, a configuration in which only the plurality of inductors is included or a configuration in which only the plurality of capacitors is included. Alternatively, the configuration of the output matching circuit 13 may be a configuration in which only one inductor is included or a configuration in which only one capacitor is included.

(2.7) Input Matching Circuit

As illustrated in FIG. 1, the input matching circuit 23 is disposed between each of the reception filters 22A and 22B and the low-noise amplifier 21 on a corresponding one of the reception paths T2. The input matching circuit 23 is a circuit for performing impedance matching between each of the reception filters 22A and 22B and the low-noise amplifier 21.

The input matching circuit 23 has a configuration in which, for example, one inductor (not illustrated) is included. Note that the configuration of the input matching circuit 23 is not limited to the configuration in which one inductor is included and may be a configuration in which, for example, a plurality of inductors are included or a configuration in which the plurality of inductors and a plurality of capacitors are included. In sum, the input matching circuit 23 includes at least one inductor.

(2.8) Matching Circuits

As illustrated in FIG. 1, the matching circuit 71A disposed between the transmission filter 12A and the first switch 4 on a corresponding one of the transmission paths T1 and between the first switch 4 and the reception filter 22A on a corresponding one of the reception paths T2. In more detail, the matching circuit 71A is disposed on the first transmission path T11 and on the first reception path T21. In addition, as illustrated in FIG. 1, the matching circuit 71B is disposed between the first switch 4 and the transmission filter 12B on a corresponding one of the transmission paths T1 and between the first switch 4 and the reception filter 22B on a corresponding one of the reception paths T2. In more detail, the matching circuit 71B is disposed on the second transmission path T12 and on the second reception path T22.

Each of the matching circuits 71A and 71B has a configuration in which, for example, one inductor (not illustrated) is included. The inductor of each of the matching circuits 71A and 71B is disposed, for example, between a node and the ground on the corresponding transmission path T1. Note that the configuration of each of the matching circuits 71A and 71B is not limited to the configuration in which one inductor is included and may be, for example, a configuration in which a plurality of inductors are included or a configuration in which the plurality of inductors and a plurality of capacitors are included.

(2.9) Switches

As illustrated in FIG. 1, the first switch 4 is a switch for switching between paths (the transmission path T1 and the reception path T2) for connection to an antenna 310. The first switch 4 has a common terminal 40 and two selective terminals 41 and 42. The common terminal 40 is connected to the antenna terminal 81. The selective terminal 41 is connected to the matching circuit 71A. The selective terminal 42 is connected to the matching circuit 71B.

The first switch 4 is a switch, for example, that allows at least one or more of the two selective terminals 41 and 42 to be selected for the common terminal 40. Note that the first switch 4 is a switch that allows, for example, the connection on a one-to-one basis and on a one-to-many basis. The first switch 4 is, for example, a switch integrated circuit (IC). The first switch 4 is controlled, for example, by the controller 14. The first switch 4 performs switching between the states of connection between the common terminal 40 and the two selective terminals 41 and 42 in accordance with a control signal from the controller 14.

As illustrated in FIG. 1, the second switch 5 is a switch for switching between the reception paths T2 (the first reception path T21 and the second reception path T22). The second switch 5 has a common terminal 50 and two selective terminals 51 and 52. The common terminal 50 is connected to the low-noise amplifier 21 with the input matching circuit 23 interposed therebetween. The selective terminal 51 is connected to the output terminal of the reception filter 22A (the reception terminal of the duplexer 32A). The selective terminal 52 is connected to the output terminal of the reception filter 22B (the reception terminal of the duplexer 32B).

The second switch 5 is a switch, for example, that allows at least one or more of the two selective terminals 51 and 52 to be connected to the common terminal 50. Note that the second switch 5 is a switch that allows, for example, the connection on a one-to-one basis and on a one-to-many basis. The second switch 5 is, for example, a switch IC. The second switch 5 is controlled, for example, by the controller 14. The second switch 5 performs switching between the states of connection between the common terminal 50 and the two selective terminals 51 and 52 in accordance with a control signal from the controller 14.

As illustrated in FIG. 1, the third switch 6 is a switch for switching between the transmission paths T1 (the first transmission path T11 and the second transmission path T12). The third switch 6 has a common terminal 60 and two selective terminals 61 and 62. The common terminal 60 is connected to the power amplifier 11 with the output matching circuit 13 interposed therebetween. The selective terminal 61 is connected to the input terminal of the transmission filter 12A (the transmission terminal of the duplexer 32A). The selective terminal 62 is connected to the input terminal of the transmission filter 12B (the transmission terminal of the duplexer 32B).

The third switch 6 is, for example, a switch that allows at least one or more of the two selective terminals 61 and 62 to be connected to the common terminal 60. Note that the third switch 6 is a switch that allows, for example, the connection on a one-to-one basis and on a one-to-many basis. The third switch 6 is, for example, a switch IC. The third switch 6 is controlled, for example, by the controller 14. The third switch 6 performs switching between the states of connection between the common terminal 60 and the two selective terminals 61 and 62 in accordance with a control signal from the controller 14.

(2.10) Controller

The controller 14 is connected to the power amplifier 11. The controller 14 is connected to the signal processing circuit 301 with a plurality of (four, in the illustrated example) control terminals 84 interposed therebetween. The plurality of control terminals 84 are each a terminal for inputting, to the controller 14, a control signal from the external circuit (for example, the signal processing circuit 301). The controller 14 controls the power amplifier 11 based on the control signals acquired from the plurality of control terminals 84. The plurality of control terminals 84 support, for example, the mobile industry processor interface (MIPI) standard.

The controller 14 controls the power amplifier 11 in accordance with a control signal from a RF-signal processing circuit 302. Specifically, the controller 14 receives the control signal from the RF-signal processing circuit 302 and, for example, supplies bias current to the power amplifier 11 in accordance with the control signal.

The controller 14 is also connected to the first switch 4, the second switch 5, and the third switch 6 and also controls the first switch 4, the second switch 5, and the third switch 6 based on the control signals described above.

(2.11) External Connection Terminals

As illustrated in FIG. 1, the plurality of external connection terminals 8 include the antenna terminal 81, the input terminal 82, the output terminal 83, and the plurality of (four, in the illustrated example) control terminals 84. The antenna terminal 81 is a terminal to which the antenna 310 is connected. The input terminal 82 and the output terminal 83 are connected to the signal processing circuit 301. The input terminal 82 is a terminal through which a high-frequency signal (transmission signal) from the external circuit is inputted to the high-frequency module 1. The output terminal 83 is a terminal through which a high-frequency signal (reception signal) from the low-noise amplifier 21 is outputted to the external circuit. The plurality of control terminals 84 are each a terminal for inputting, to the controller 14, the control signal from the external circuit (for example, the signal processing circuit 301).

(3) High-Frequency Module Structure

Hereinafter, the structure of the high-frequency module 1 according to Embodiment 1 will be described with reference to the drawings.

As illustrated in FIGS. 2A and 2B, the high-frequency module 1 includes the mounting substrate 9, a plurality of circuit elements, and the plurality of (three, in the illustrated example) external connection terminals 8. The high-frequency module 1 also includes the first resin layer 101, the second resin layer 102, the shield layer 103, and the conductive member 20. The high-frequency module 1 includes, as the plurality of circuit elements, the power amplifier 11, the low-noise amplifier 21, the duplexers 32A and 32B, the filter 33, the output matching circuit 13, the input matching circuit 23, the matching circuits 71A and 71B, the first to third switches 4 to 6, and the controller 14. Note that in FIGS. 2A and 2B, the illustration of the low-noise amplifier 21, the filter 33, and the controller 14 among the plurality of circuit elements is omitted.

The high-frequency module 1 is electrically connectable to an external board (not illustrated). The external board corresponds to, for example, the mother board of a cellular phone, a communication apparatus, and the like. Note that the case where the high-frequency module 1 is electrically connectable to the external board includes not only a case where the high-frequency module 1 is mounted directly on the external board but also a case where the high-frequency module 1 is mounted indirectly on the external board. In addition, the case where the high-frequency module 1 is mounted indirectly on the external board is, for example, a case where the high-frequency module 1 is mounted on a different high-frequency module mounted on the external board.

(3.1) Mounting Substrate

As illustrated in FIGS. 2A and 2B, the mounting substrate 9 has a first main surface 91 and a second main surface 92. The first main surface 91 and the second main surface 92 are opposite from each other in a depth direction D1 of the mounting substrate 9. When the high-frequency module 1 is disposed on the external board (not illustrated), the second main surface 92 faces the external board. The mounting substrate 9 is a double-sided mounting substrate having the circuit elements mounted on each of the first main surface 91 and the second main surface 92.

The mounting substrate 9 is a multi-layer substrate in which a plurality of dielectric layers are laminated. The mounting substrate 9 has a plurality of conductive pattern portions 94 and a plurality of columnar electrodes 95. The plurality of conductive pattern portions 94 include a conductive pattern portion the potential of which is set at the ground potential. The plurality of columnar electrodes 95 are used for electrical connection of the circuit elements mounted on the first main surface 91 with the conductive pattern portions 94 of the mounting substrate 9. The plurality of columnar electrodes 95 are also used for electrical connection of the external connection terminals 8 with the circuit elements mounted on the first main surface 91 and the conductive pattern portions 94 of the mounting substrate 9.

(3.2) Power Amplifier

As illustrated in FIG. 2A, the power amplifier 11 is located on the first main surface 91 side of the mounting substrate 9. In the example in FIG. 2A, the power amplifier 11 is mounted on the first main surface 91 of the mounting substrate 9. Note that part of the power amplifier 11 may be mounted on the first main surface 91 of the mounting substrate 9, and the remaining part of the power amplifier 11 may be mounted in the mounting substrate 9. In sum, the power amplifier 11 is located closer to the first main surface 91 side of the mounting substrate 9 than to the second main surface 92 and has at least a portion mounted on the first main surface 91.

(3.3) Duplexers

As illustrated in FIGS. 2A and 2B, the duplexer 32A is located on the first main surface 91 side of the mounting substrate 9. In the example in FIGS. 2A and 2B, the duplexer 32A is mounted on the first main surface 91 of the mounting substrate 9. Note that part of the duplexer 32A may be mounted on the first main surface 91 of the mounting substrate 9, and the remaining part of the duplexer 32A may be mounted in the mounting substrate 9. In sum, the duplexer 32A is located closer to the first main surface 91 side of the mounting substrate 9 than to the second main surface 92 and has at least a portion mounted on the first main surface 91.

The transmission filter 12A in the duplexer 32A is, for example, an acoustic wave filter including a plurality of serial arm resonators and a plurality of parallel arm resonators. The acoustic wave filter is, for example, a surface acoustic wave (SAW) filter using a surface acoustic wave. Further, the transmission filter 12A may include at least one of an inductor and a capacitor that is connected in series or in parallel to one of the plurality of serial arm resonators or may include an inductor or a capacitor that is connected in series or in parallel to one of the plurality of parallel arm resonators.

In addition, as illustrated in FIG. 2B, the duplexer 32A has a first main surface 321 and a second main surface 322. The first main surface 321 and the second main surface 322 are opposite from each other in a depth direction of the duplexer 32A. When the duplexer 32A is mounted on the mounting substrate 9, the second main surface 322 faces the first main surface 91 of the mounting substrate 9.

Like the transmission filter 12A, the reception filter 22A in the duplexer 32A is, for example, an acoustic wave filter including a plurality of serial arm resonators and a plurality of parallel arm resonators. The acoustic wave filter is, for example, a SAW filter using a surface acoustic wave. Further, the reception filter 22A may include at least one of an inductor and a capacitor that is connected in series or in parallel to one of the plurality of serial arm resonators or may include an inductor or a capacitor that is connected in series or in parallel to one of the plurality of parallel arm resonators.

As illustrated in FIG. 2A, the duplexer 32B is located on the first main surface 91 side of the mounting substrate 9. In the example in FIG. 2A, the duplexer 32B is mounted on the first main surface 91 of the mounting substrate 9. Note that part of the duplexer 32B is mounted on the first main surface 91 of the mounting substrate 9, and the remaining part of the duplexer 32B may be mounted in the mounting substrate 9. In sum, the duplexer 32B is located closer to the first main surface 91 side of the mounting substrate 9 than to the second main surface 92 and has at least a portion mounted on the first main surface 91.

The transmission filter 12B in the duplexer 32B is, for example, an acoustic wave filter including a plurality of serial arm resonators and a plurality of parallel arm resonators. The acoustic wave filter is, for example, a SAW filter using a surface acoustic wave. Further, the transmission filter 12B may include at least one of an inductor and a capacitor that is connected in series or in parallel to one of the plurality of serial arm resonators or may include an inductor or a capacitor that is connected in series or in parallel to one of the plurality of parallel arm resonators.

Like the transmission filter 12B, the reception filter 22B in the duplexer 32B is, for example, an acoustic wave filter including a plurality of serial arm resonators and a plurality of parallel arm resonators. The acoustic wave filter is, for example, a SAW filter using a surface acoustic wave. Further, the reception filter 22B may include at least one of an inductor and a capacitor that is connected in series or in parallel to one of the plurality of serial arm resonators or may include an inductor or a capacitor that is connected in series or in parallel to one of the plurality of parallel arm resonators.

(3.4) Filter

The filter 33 is not illustrated in FIGS. 2A and 2B but is located on the second main surface 92 side of the mounting substrate 9. Note that part of the filter 33 may be mounted on the second main surface 92 of the mounting substrate 9, and the remaining part of the filter 33 may be mounted in the mounting substrate 9. In sum, the filter 33 is located closer to the second main surface 92 side of the mounting substrate 9 than to the first main surface 91 and has at least a portion mounted on the second main surface 92.

(3.5) Output Matching Circuit

As illustrated in FIGS. 2A and 2B, the output matching circuit 13 is located on the first main surface 91 side of the mounting substrate 9. An inductor 131 of the output matching circuit 13 is, for example, a chip-shaped element mounted on the first main surface 91 of the mounting substrate 9 or is a conductive pattern portion mounted in the mounting substrate 9. In the example in FIGS. 2A and 2B, the inductor 131 of the output matching circuit 13 is mounted on the first main surface 91 of the mounting substrate 9. Note that the output matching circuit 13 may include a capacitor (not illustrated) together with the inductor 131. The capacitor has, for example, a configuration in which a chip-shaped element mounted on the first main surface 91 of the mounting substrate 9 or two conductive pattern portions that are mounted in the mounting substrate 9 and that are opposite from each other are included. In sum, the output matching circuit 13 is located closer to the first main surface 91 side of the mounting substrate 9 than to the second main surface 92 and has at least a portion mounted on the first main surface 91. In this embodiment, the inductor 131 of the output matching circuit 13 is a first matching inductor.

(3.6) Input Matching Circuit

As illustrated in FIG. 2A, the input matching circuit 23 is located on the first main surface 91 side of the mounting substrate 9. An inductor 231 of the input matching circuit 23 is, for example, a chip-shaped element mounted on the first main surface 91 of the mounting substrate 9 or a conductive pattern portion mounted in the mounting substrate 9. In the example in FIG. 2A, the inductor 231 of the input matching circuit 23 is mounted on the first main surface 91 of the mounting substrate 9. Note that the input matching circuit 23 may include a capacitor (not illustrated) together with the inductor 231. The capacitor has, for example, a configuration in which a chip-shaped element mounted on the first main surface 91 of the mounting substrate 9 or two conductive pattern portions that are mounted in the mounting substrate 9 and that are opposite from each other are included. In sum, the input matching circuit 23 is located closer to the first main surface 91 side of the mounting substrate 9 than to the second main surface 92 and has at least a portion mounted on the first main surface 91. In this embodiment, the inductor 231 of the input matching circuit 23 is a second matching inductor.

(3.7) Matching Circuits

As illustrated in FIGS. 2A and 2B, the matching circuit 71A is located on the first main surface 91 side of the mounting substrate 9. An inductor 711 of the matching circuit 71A is, for example, a chip-shaped element mounted on the first main surface 91 of the mounting substrate 9 or a conductive pattern portion mounted in the mounting substrate 9. In the example in FIGS. 2A and 2B, the inductor 711 of the matching circuit 71A is mounted on the first main surface 91 of the mounting substrate 9. Note that the matching circuit 71A may include a capacitor (not illustrated) together with the inductor 711. The capacitor has, for example, a configuration in which a chip-shaped element mounted on the first main surface 91 of the mounting substrate 9 or two conductive pattern portions that are mounted in the mounting substrate 9 and that are opposite from each other are included. In sum, the matching circuit 71A is located closer to the first main surface 91 side of the mounting substrate 9 than to the second main surface 92 and has at least a portion mounted on the first main surface 91.

As illustrated in FIG. 2A, the matching circuit 71B is located on the first main surface 91 side of the mounting substrate 9. An inductor 712 of the matching circuit 71B is, for example, a chip-shaped element mounted on the first main surface 91 of the mounting substrate 9 or a conductive pattern portion mounted in the mounting substrate 9. In the example in FIG. 2A, the inductor 712 of the matching circuit 71B is mounted on the first main surface 91 of the mounting substrate 9. Note that the matching circuit 71B may include a capacitor (not illustrated) together with the inductor 712. The capacitor has, for example, a configuration in which a chip-shaped element mounted on the first main surface 91 of the mounting substrate 9 or two conductive pattern portions that are mounted in the mounting substrate 9 and that are opposite from each other are included. In sum, the matching circuit 71B is located closer to the first main surface 91 side of the mounting substrate 9 than to the second main surface 92 and has at least a portion mounted on the first main surface 91.

In this embodiment, the respective inductors 711 and 712 of the matching circuits 71A and 71B are each a third matching inductor.

(3.8) Low-Noise Amplifier

The low-noise amplifier 21 is not illustrated in FIGS. 2A and 2B but is located on the second main surface 92 side of the mounting substrate 9. Note that part of the low-noise amplifier 21 may be mounted on the second main surface 92 of the mounting substrate 9, and the remaining part of the low-noise amplifier 21 may be mounted in the mounting substrate 9. In sum, the low-noise amplifier 21 is located on the second main surface 92 side of the mounting substrate 9 and has at least a portion mounted on the second main surface 92.

(3.9) First Switch

As illustrated in FIG. 2A, the first switch 4 is located on the first main surface 91 side of the mounting substrate 9. In the example in FIG. 2A, the first switch 4 is mounted on the first main surface 91 of the mounting substrate 9. Note that part of the first switch 4 may be mounted on the first main surface 91 of the mounting substrate 9, and the remaining part of the first switch 4 may be mounted in the mounting substrate 9. In sum, the first switch 4 is located closer to the first main surface 91 side of the mounting substrate 9 than to the second main surface 92 and has at least a portion mounted on the first main surface 91.

(3.10) Second Switch

As illustrated in FIG. 2B, the second switch 5 is located on the second main surface 92 side of the mounting substrate 9. In the example in FIG. 2B, the second switch 5 is mounted on the second main surface 92 of the mounting substrate 9. Note that part of the second switch 5 may be mounted on the second main surface 92 of the mounting substrate 9, and the remaining part of the second switch 5 may be mounted in the mounting substrate 9. In sum, the second switch 5 is located closer to the second main surface 92 side of the mounting substrate 9 than to the first main surface 91 and has at least a portion mounted on the second main surface 92.

(3.11) Third Switch

As illustrated in FIG. 2B, the third switch 6 is located on the second main surface 92 side of the mounting substrate 9. In the example in FIG. 2B, the third switch 6 is mounted on the second main surface 92 of the mounting substrate 9. Note that part of the third switch 6 may be mounted on the second main surface 92 of the mounting substrate 9, and the remaining part of the third switch 6 may be mounted in the mounting substrate 9. In sum, the third switch 6 is located closer to the second main surface 92 side of the mounting substrate 9 than to the first main surface 91 and has at least a portion mounted on the second main surface 92. In this embodiment, the second switch 5 and the third switch 6 are respectively a first inductor L1 and a second inductor L2 and are each also another component different from a high-frequency component 2.

(3.12) Controller

The controller 14 is not illustrated in FIGS. 2A and 2B but is located on the second main surface 92 side of the mounting substrate 9. Note that part of the controller 14 may be mounted on the second main surface 92 of the mounting substrate 9, and the remaining part of the controller 14 may be mounted in the mounting substrate 9. In sum, the controller 14 is located closer to the second main surface 92 side of the mounting substrate 9 than to the first main surface 91 and has at least a portion mounted on the second main surface 92.

(3.13) External Connection Terminals

The plurality of external connection terminals 8 illustrated in FIG. 2A are each a terminal for electrically connecting the mounting substrate 9 and the external board (not illustrated). The plurality of external connection terminals 8 include the antenna terminal 81, the input terminal 82, the output terminal 83, and the plurality of control terminals 84 each of which is illustrated in FIG. 1.

The plurality of external connection terminals 8 are located on the second main surface 92 of the mounting substrate 9. The plurality of external connection terminals 8 are each a columnar (for example, pillar shaped) electrode disposed on the second main surface 92 of the mounting substrate 9. The material of the plurality of external connection terminals 8 is, for example, a metal (such as copper or a copper alloy). Each of the plurality of external connection terminals 8 has a proximal end portion and a distal end portion opposite to the proximal end portion, in the depth direction D1 of the mounting substrate 9. The proximal end portion is bonded to the second main surface 92 of the mounting substrate 9. The distal end portion of each of the plurality of external connection terminals 8 may include, for example, a gold-plated layer.

(3.14) Resin Layer

As illustrated in FIG. 2B, the first resin layer 101 is disposed on the first main surface 91 of the mounting substrate 9 and covers the first main surface 91 and the circuit elements located on the first main surface 91. The first resin layer 101 has a function of ensuring reliability such as the mechanical strength (impact resistance) and the humidity resistance of the circuit elements located on the first main surface 91. That is, the first resin layer 101 has a function of protecting the circuit elements located on the first main surface 91.

As illustrated in FIG. 2B, the second resin layer 102 is disposed on the second main surface 92 of the mounting substrate 9 and covers the second main surface 92 and the circuit elements located on the second main surface 92. The second resin layer 102 has a function of ensuring the reliability such as the mechanical strength (impact resistance) and the humidity resistance of the circuit elements located on the second main surface 92. That is, the second resin layer 102 has a function of protecting the circuit elements located on the second main surface 92.

(3.15) Shield Layer

The shield layer 103 covers a main surface 1011 and an outer side-surrounding surface 1013 of the first resin layer 101, an outer side-surrounding surface 93 of the mounting substrate 9, and an outer side-surrounding surface 1023 of the second resin layer 102. The material of the shield layer 103 is, for example, a metal. The shield layer 103 is in contact with the grounding layer of the mounting substrate 9. This enables the potential of the shield layer 103 to be the same as the potential of the grounding layer. That is, the shield layer 103 is connected to the ground. The phrase "connected to the ground" in this specification denotes "electrically connected to the ground". In addition, the case "electrically connected to the ground" in this specification includes not only the case of being directly electrically connected to the ground but also the case of being indirectly electrically connected to the ground, for example, with a conductive pattern portion 94 interposed therebetween.

(3.16) Conductive Member

The conductive member 20 includes, for example, a conductive wire 201. The conductive wire 201 is connected to both of the duplexer 32A and the shield layer 103 and is disposed between the duplexer 32A and the shield layer 103 in the depth direction D1 of the mounting substrate 9. The conductive wire 201 is also electrically connected to the shield layer 103. In this embodiment, the conductive wire 201 is connected to the first main surface 321 serving as a main surface of the duplexer 32A, the first main surface 321 facing the shield layer 103.

Here, a method for connecting the conductive wire 201 to the duplexer 32A and the shield layer 103 will be described briefly. First, both end portions of the conductive wire 201 are connected to the first main surface 321 of the duplexer 32A in such a manner that the conductive wire 201 is bent in an arch shape to project toward a portion opposite to the duplexer 32A. The first resin layer 101 is then formed in such a manner as to cover the conductive wire 201 and the first main surface 321 of the duplexer 32A. Further, an end portion, of the conductive wire 201, opposite to the duplexer 32A is exposed by grinding a surface, of the first resin layer 101, opposite to the duplexer 32A. Lastly, the shield layer 103 is formed in such a manner as to cover the main surface 1011 of the first resin layer 101. The conductive member 20 and the shield layer 103 are thereby electrically connected. In this embodiment, the duplexer 32A is the high-frequency component 2.

As described above, the conductive wire 201 is covered with the first resin layer 101, and thereby the first resin layer 101 can support the conductive wire 201.

(4) Layout Relationship

Next, a layout relationship among the circuit elements included in the high-frequency module 1 will be described with reference to FIGS. 2A and 2B.

In the example in FIG. 2A, the duplexer 32A is located between the inductor (first matching inductor) 131 of the output matching circuit 13 and the inductor (third matching inductor) 711 of the matching circuit 71A. In this specification, the phrase "located between the inductor 131 and the inductor 711" denotes that at least part of the duplexer 32A is located in the region defined by lines each connecting a point of the inductor 131 and a point of the inductor 711. In the example in FIG. 2A, at least part of the duplexer 32A is located in a region R1 defined by two lines LN1 and LN2. The line LN1 is a line connecting a point P1 of the inductor 131 and a point P2 of the inductor 711. The line LN2 is a line connecting a point P3 of the inductor 131 and the point P4 of the inductor 711.

In this embodiment, the duplexer 32A is the high-frequency component 2, the inductor 131 is the first inductor L1, and the inductor 711 is the second inductor L2. The high-frequency component 2 is thus located between the first inductor L1 and the second inductor L2. In addition, in this embodiment, the conductive member 20 electrically connected to the shield layer 103 is disposed between the high-frequency component 2 and the shield layer 103 in the depth direction D1 of the mounting substrate 9. The coupling between the first inductor L1 and the second inductor L2 may thereby be diminished.

In addition, as described above, in this embodiment, the conductive member 20 is connected to the first main surface 321 that is the main surface of the high-frequency component 2, the main surface facing the shield layer 103. The layout area of the mounting substrate 9 may thus be ensured as compared with a case where the conductive member 20 is connected to the first main surface 91 of the mounting substrate 9. That is, with the high-frequency module 1 according to this embodiment, the coupling between the first inductor L1 and the second inductor L2 may be restrained, and the layout area of the mounting substrate 9 may also be ensured.

Further, in the example in FIG. 2B, a height H1 of the high-frequency component 2 is lower than each of a height H2 of the first inductor L1 and a height H3 of the second inductor L2 in the depth direction D1 of the mounting substrate 9. The high-frequency module 1 may thereby be made shorter.

In addition, in the example in FIG. 2B, the duplexer 32A overlaps with at least part of the second switch 5 in the depth direction D1 of the mounting substrate 9. As illustrated in FIG. 1, the reception filter 22A included in the duplexer 32A is connected to the second switch 5. A path from the reception filter 22A of the duplexer 32A to the second switch 5 may thus be shortened. Further, in the example in FIG. 2B, the inductor 131 of the output matching circuit 13 overlaps with at least part of the third switch 6 in the depth direction D1 of the mounting substrate 9. As illustrated in FIG. 1, the inductor 131 of the output matching circuit 13 is connected to the third switch 6. A path from the inductor 131 of the output matching circuit 13 to the third switch 6 may thus be shortened.

(5) Detailed Structure of Components of High-Frequency Module (5.1) Mounting Substrate The mounting substrate 9 illustrated in FIGS. 2A and 2B is, for example, a printed-circuit board plate, or a low temperature co-fired ceramics (LTCC) substrate. The mounting substrate 9 herein is, for example, a multi-layer substrate including a plurality of dielectric layers (not illustrated) and a plurality of conductive pattern portions 94. The plurality of dielectric layers and the plurality of conductive pattern portions 94 are stacked in the depth direction D1 of the mounting substrate 9. The plurality of conductive pattern portions 94 are each formed in a corresponding one of predetermined patterns. Each of the plurality of conductive pattern portions 94 includes one or more conductor portions on the plane orthogonal to the depth direction D1 of the mounting substrate 9. The material of each conductive pattern portion 94 is, for example, copper.

The first main surface 91 and the second main surface 92 of the mounting substrate 9 are away from each other in the depth direction D1 of the mounting substrate 9 and intersect the depth direction D1 of the mounting substrate 9. The first main surface 91 in the mounting substrate 9 is, for example, orthogonal to the depth direction D1 of the mounting substrate 9 but may include, for example, a side surface of a conductor portion, as a surface not orthogonal to the depth direction D1. The second main surface 92 in the mounting substrate 9 is also, for example, orthogonal to the depth direction D1 of the mounting substrate 9 but may include, for example, a side surface of a conductor portion, as a surface not orthogonal to the depth direction D1. The first main surface 91 and the second main surface 92 of the mounting substrate 9 may have minute unevenness, a recessed portion, or a projecting portion.

(5.2) Duplexers

The detailed structure of the duplexers 32A and 32B illustrated in FIGS. 2A and 2B will be described. The duplexer 32A and the duplexer 32B are not discriminated from each other and thus are each referred to as a duplexer in the following description.

Each duplexer is a filter as one chip. In the duplexer, for example, each of the plurality of serial arm resonators and the plurality of parallel arm resonators is configured as an acoustic wave resonator. In this case, the duplexer includes, for example, a substrate, a piezoelectric layer, and a plurality of interdigital transducer (IDT) electrodes. The substrate has a first surface and a second surface. The piezoelectric layer is disposed on the first surface of the substrate. The piezoelectric layer is disposed on a low-acoustic-velocity film. The plurality of IDT electrodes are disposed on the piezoelectric layer. The low-acoustic-velocity film herein is disposed on the substrate directly or indirectly. The piezoelectric layer is disposed on the low-acoustic-velocity film directly or indirectly. In the low-acoustic-velocity film, the acoustic velocity of a bulk wave propagating through the low-acoustic-velocity film is lower than the acoustic velocity of the bulk wave propagating through the piezoelectric layer. In the substrate, the acoustic velocity of a bulk wave propagating through the substrate is higher than the acoustic velocity of the bulk wave propagating through the piezoelectric layer. The material of the piezoelectric layer is, for example, lithium tantalate. The material of the low-acoustic-velocity film is, for example, silicon oxide. The substrate is, for example, a silicon substrate. If the wavelength of an acoustic wave determined by the electrode finger period of the IDT electrodes is $\lambda$, the depth of the piezoelectric layer is, for example, lower than or equal to $3.5\lambda$. The depth of the low-acoustic-velocity film is, for example, lower than or equal to $2.0\lambda$.

The piezoelectric layer may be formed from, for example, one of lithium tantalate, lithium niobate, zinc oxide, aluminum nitride, and PZT. The low-acoustic-velocity film may include at least one type of material selected from the group consisting of silicon oxide, glass, silicon oxynitride, tantalum pentoxide, and a compound formed by adding fluorine, carbon, or boron to silicon oxide. In addition, the substrate may include at least one type of material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

The duplexer further includes, for example, a spacer layer and a cover member. The spacer layer and the cover member are disposed on the first surface of the substrate. The spacer layer surrounds the plurality of IDT electrodes in a plan view in the depth direction of the substrate. The spacer layer is of a frame shape (rectangular frame shape) in the plan view in the depth direction of the substrate. The spacer layer is electrically insulative. The material of the spacer layer is, for example, a synthetic resin such as an epoxy resin or polyimide. The cover member has a plate shape. The shape of the cover member is a rectangle in the plan view in the depth direction of the substrate but is not limited to this. The shape may be, for example, a square. In the filter, the outer size of the cover member, the outer size of the spacer layer, and the outer size of the cover member are substantially identical in the plan view in the depth direction of the substrate. The cover member is located on the spacer layer in such a manner as to face the substrate in the depth direction of the substrate. The cover member overlaps with the plurality of IDT electrodes in the depth direction of the substrate and is away from the plurality of IDT electrodes in the depth direction of the substrate. The cover member is electrically insulative. The material of the cover member is, for example, a synthetic resin such as an epoxy resin or polyimide. The filter has a space surrounded by the substrate, the spacer layer, and the cover member. The filter has a gas in the space. The gas is, for example, air or an inert gas (for example, a nitrogen gas). A plurality of terminals are exposed from the cover member. The plurality of terminals are each, for example, a bump. The bump is, for example, a solder bump. The bump is not limited to the solder bump and may be, for example, a gold bump.

The duplexer may include, for example, a close-contact layer interposed between the low-acoustic-velocity film and the piezoelectric layer. The close-contact layer is formed from, for example, a resin (an epoxy resin or a polyimide resin). The duplexer may also include a dielectric film between the low-acoustic-velocity film and the piezoelectric layer, on the piezoelectric layer, or under the low-acoustic-velocity film.

The duplexer may also include, for example, a high-acoustic-velocity film interposed between the substrate and the low-acoustic-velocity film. The high-acoustic-velocity film is herein disposed on the substrate directly or indirectly. The low-acoustic-velocity film is disposed on the high-acoustic-velocity film directly or indirectly. The piezoelectric layer is disposed on the low-acoustic-velocity film directly or indirectly. In the high-acoustic-velocity film, the acoustic velocity of the bulk wave propagating through the high-acoustic-velocity film is higher than the acoustic velocity of the acoustic wave propagating through the piezoelectric layer. In the low-acoustic-velocity film, the acoustic velocity of the bulk wave propagating through the low-acoustic-velocity film is lower than the acoustic velocity of the bulk wave propagating through the piezoelectric layer.

The high-acoustic-velocity film is formed from: a piezoelectric body such as diamondlike carbon, aluminum nitride, aluminum oxide, silicon carbide, silicon nitride, silicon, sapphire, lithium tantalate, lithium niobate, or crystal; any of various ceramics such as alumina, zirconia, cordierite, mullite, steatite, and forsterite; magnesia; diamond; a material having any of the materials described above serving as a main component; or a material having a mixture of the materials described above serving as a main component.

The high-acoustic-velocity film has a function of confining the acoustic wave in the piezoelectric layer and the low-acoustic-velocity film. Accordingly, regarding the depth of the high-acoustic-velocity film, the deeper the high-acoustic-velocity film, the more desirable the high-acoustic-velocity film. The piezoelectric substrate may have a close-contact layer, a dielectric film, or another layer as a film other than the high-acoustic-velocity film, the low-acoustic-velocity film, and the piezoelectric layer.

Each of the plurality of serial arm resonators and the plurality of parallel arm resonators is not limited to the acoustic wave resonator described above and may be, for example, a SAW resonator or a bulk acoustic wave (BAW) resonator. The SAW resonator herein includes, for example, the piezoelectric substrate and the IDT electrodes disposed on the piezoelectric substrate. If the plurality of serial arm resonators and the plurality of parallel arm resonators are each configured as the SAW resonator, the filter has, on one piezoelectric substrate, the plurality of IDT electrodes for the plurality of respective serial arm resonators and the plurality of IDT electrodes for the plurality of respective parallel arm resonators. The piezoelectric substrate is, for example, a lithium tantalate substrate or a lithium niobate substrate.

(5.3) Switches

The detailed structure of the first switch 4, the second switch 5, and the third switch 6 that are illustrated in FIGS. 2A and 2B will be described. The first switch 4, the second switch 5, and the third switch 6 are not discriminated from each other and thus are each referred to as a switch in the following description.

The switch is a switch IC. In more detail, the switch is, for example, an IC as one chip including a substrate and a switch functional unit. The substrate has a first surface and a second surface that are opposite from each other. The substrate is, for example, a silicon substrate. The switch functional unit includes a field effect transistor (FET) formed on the first surface of the substrate. The switch functional unit is a functional unit having a function of performing switching between connection states. Flip-chip mounting of the switch is performed on the first main surface 91 or the second main surface 92 of the mounting substrate 9 to cause the first surface of the substrate to face the mounting substrate 9. In the plan view in the depth direction D1 of the mounting substrate 9, the switch has a square outline.

(5.4) Power Amplifier

The power amplifier 11 illustrated in FIG. 2A is, for example, an IC as one chip including a substrate and an amplification functional unit. The substrate has a first surface and a second surface that are opposite from each other. The substrate is, for example, a gallium arsenide substrate. The amplification functional unit includes at least one transistor formed on the first surface of the substrate. The amplification functional unit is a functional unit having a function of amplifying a transmission signal in a predetermined frequency band. The transistor is, for example, a heterojunction bipolar transistor (HBT). In the power amplifier 11, a supply voltage from the controller 14 is applied between a collector and an emitter of the HBT. The power amplifier 11 may include, for example, a capacitor for cutting direct current in addition to the amplification functional unit. Flip-chip mounting of the power amplifier 11 is performed on the first main surface 91 of the mounting substrate 9, for example, to cause the first surface of the substrate to face the first main surface 91 of the mounting substrate 9. In the plan view in the depth direction D1 of the mounting substrate 9, the power amplifier 11 has a square outline.

(5.5) Low-Noise Amplifier

The low-noise amplifier 21 is not illustrated in FIGS. 2A and 2B but is, for example, an IC chip including a substrate and an amplification functional unit. The substrate has a first surface and a second surface that are opposite from each other. The substrate is, for example, a silicon substrate. The amplification functional unit is formed on the first surface of the substrate. The amplification functional unit is a functional unit having a function of amplifying a reception signal in a predetermined frequency band. Flip-chip mounting of the low-noise amplifier 21 is performed on the mounting substrate 9, for example, to cause the first surface of the substrate to face the mounting substrate 9. In the plan view in the depth direction D1 of the mounting substrate 9, the low-noise amplifier 21 has a square outline.

(6) Communication Apparatus

As illustrated in FIG. 1, the communication apparatus 300 according to Embodiment 1 includes the high-frequency module 1, the antenna 310, and the signal processing circuit 301.

(6.1) Antenna

The antenna 310 is connected to the antenna terminal 81 of the high-frequency module 1. The antenna 310 has a transmission function of radiating, as a radio wave, a transmission signal outputted from the high-frequency module 1 and a reception function of receiving a reception signal as a radio wave from an external apparatus and then outputting the signal to the high-frequency module 1. The first transmission signal and the second transmission signal are cited as examples of the transmission signal. The first reception signal and the second reception signal are cited as examples of the reception signal.

(6.2) Signal Processing Circuit

The signal processing circuit 301 includes the RF-signal processing circuit 302 and a baseband-signal processing circuit 303. The signal processing circuit 301 processes first communication signals (the first transmission signal and the first reception signal) and second communication signals (the second transmission signal and the second reception signal).

(6.2.1) RF Signal Processing Circuit

The RF-signal processing circuit 302 is, for example, a radio frequency integrated circuit (RFIC) and performs signal processing of a high-frequency signal. The RF-signal processing circuit 302 performs signal processing, such as upconverting, of a high-frequency signal (transmission signal) outputted from the baseband-signal processing circuit 303 and outputs the high-frequency signal subjected to the signal processing to the high-frequency module 1. The RF-signal processing circuit 302 performs signal processing, such as downconverting, of a high-frequency signal (reception signal) outputted from the high-frequency module 1 and outputs the high-frequency signal subjected to the signal processing to the baseband-signal processing circuit 303.

(6.2.2) Baseband-Signal Processing Circuit

The baseband-signal processing circuit 303 is, for example, a baseband integrated circuit (BBIC) and performs predetermined signal processing of a signal transmitted from outside the signal processing circuit 301. The received signal processed by the baseband-signal processing circuit 303 is used, for example, as an image signal for image displaying as an image signal or an audio signal for calling.

(7) Advantageous Effects

In the high-frequency module 1 according to Embodiment 1, the high-frequency component 2 (duplexer 32A) is located between the first inductor L1 (inductor 131) and the second inductor L2 (inductor 711), and the high-frequency component 2 and the shield layer 103 are connected, with the conductive member 20 interposed therebetween. The coupling between the first inductor L1 and the second inductor L2 may thereby be diminished.

In addition, in the high-frequency module 1 according to the embodiment, the conductive member 20 is connected to the first main surface 321 of the high-frequency component 2. The layout area of the mounting substrate 9 may thereby be ensured as compared with the case where the conductive member 20 is connected to the first main surface 91 of the mounting substrate 9. That is, with the high-frequency module 1 according to Embodiment 1, the coupling between the first inductor L1 and the second inductor L2 may be restrained, and the layout area of the mounting substrate 9 may also be ensured.

Further, in the high-frequency module 1 according to Embodiment 1, the height H1 of the high-frequency component 2 is lower than each of the height H2 of the first inductor L1 and the height H3 of the second inductor L2 in the depth direction D1 of the mounting substrate 9. The high-frequency module 1 may thereby be made shorter.

In addition, in the high-frequency module 1 according to Embodiment 1, the mounting substrate 9 is a double-sided mounting substrate. The high-frequency module 1 may thereby be downsized.

(8) Modifications

Hereinafter, modifications of Embodiment 1 will be described.

(8.1) Modification 1

Figure 3A:
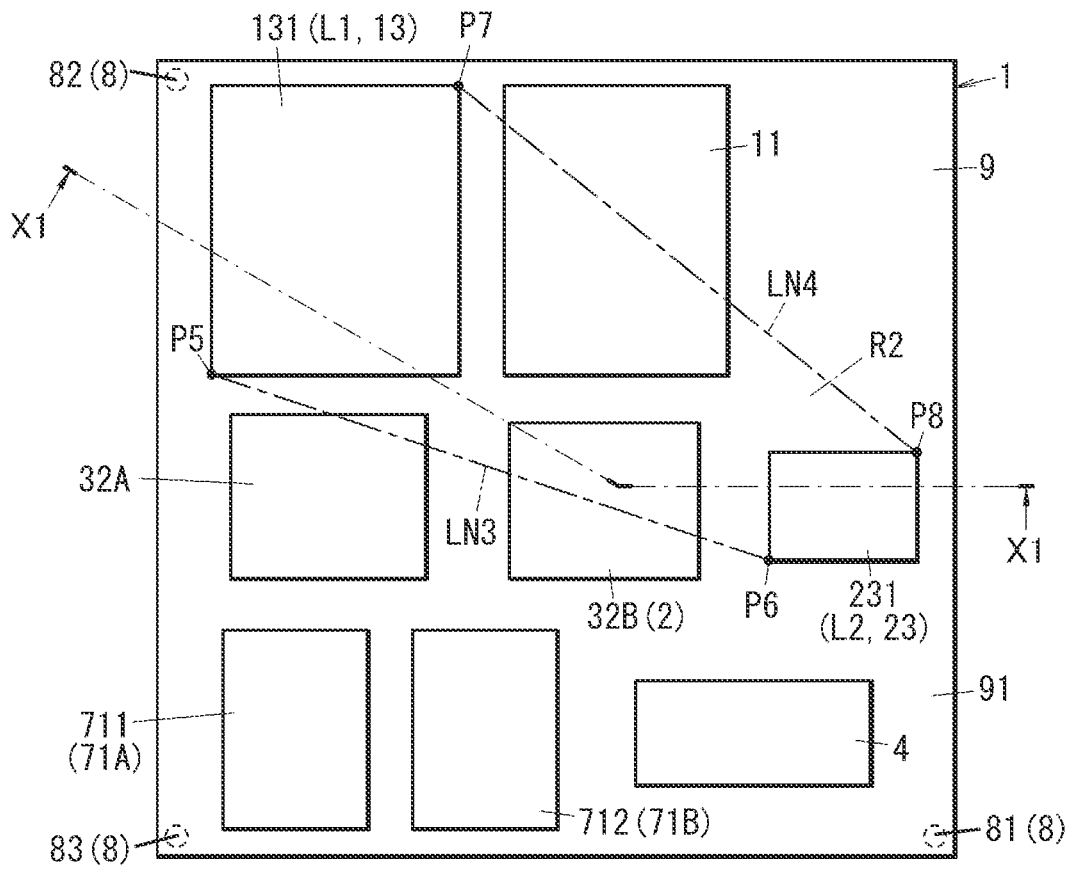
FIG. 3A is a plan view of the high-frequency module according to Modification 1 of Embodiment 1.
Figure 3B:
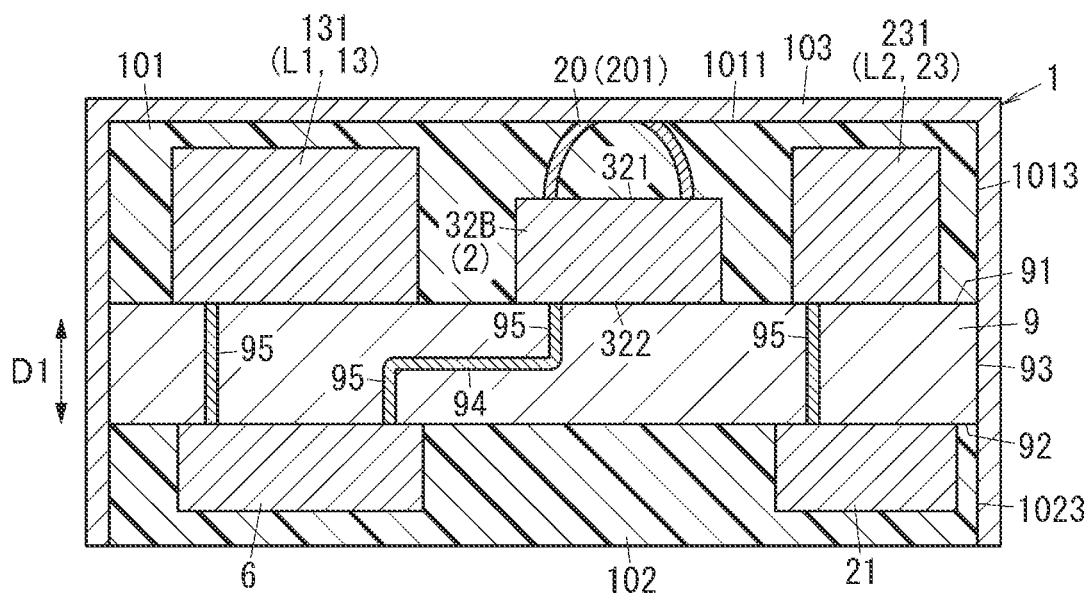
FIG. 3B is a cross-sectional view taken along the X1-X1 line in FIG. 3A.

As illustrated in FIG. 3B, conductive wires 201 each serving as the conductive member 20 may be connected to the first main surface 321 of the duplexer 32B. Hereinafter, the high-frequency module 1 according to Modification 1 will be described with reference to FIGS. 3A and 3B. Note that regarding the high-frequency module 1 according to Modification 1, the configuration except the conductive wires 201 is the same as that of the high-frequency module 1 according to Embodiment 1. The same components are denoted by the same reference numerals, and the description thereof is omitted.

As illustrated in FIG. 3B, in the high-frequency module 1 according to Modification 1, each conductive wire 201 serving as the conductive member 20 is disposed between the duplexer 32B and the shield layer 103 in the depth direction D1 of the mounting substrate 9. In more detail, a first end portion of the conductive wire 201 in the depth direction D1 of the mounting substrate 9 is connected to the shield layer 103, and a second end portion thereof in the depth direction D1 is connected to the first main surface 321 of the duplexer 32B. The conductive wire 201 is also electrically connected to the shield layer 103.

In the example in FIG. 3A, the duplexer 32B is located between the inductor (first matching inductor) 131 of the output matching circuit 13 and the inductor (second matching inductor) 231 of the input matching circuit 23. That is, in the high-frequency module 1 according to Modification 1, the duplexer 32B is the high-frequency component 2, the inductor 131 is the first inductor L1, and the inductor 231 is the second inductor L2.

In the example in FIG. 3A, at least part of the duplexer 32B serving as the high-frequency component 2 is located in a region R2 defined by two lines LN3 and LN4. The line LN3 is a line connecting a point P5 of the inductor 131 and a point P6 of the inductor 231. The line LN4 is a line connecting a point P7 of the inductor 131 and a point P8 of the inductor 231.

In addition, in the high-frequency module 1 according to Modification 1, the conductive members 20 electrically connected to the shield layer 103 are disposed between the high-frequency component 2 and the shield layer 103 in the depth direction D1 of the mounting substrate 9. The coupling between the first inductor L1 and the second inductor L2 may thereby be diminished.

In addition, as described above, in the high-frequency module 1 according to Modification 1, the conductive members 20 are connected to the first main surface 321 of the high-frequency component 2 (duplexer 32B). The layout area of the mounting substrate 9 may thus be ensured as compared with the case where the conductive member 20 is connected to the first main surface 91 of the mounting substrate 9. That is, with the high-frequency module 1 according to Modification 1, the coupling between the first inductor L1 and the second inductor L2 may be restrained, and the layout area of the mounting substrate 9 may also be ensured.

(8.2) Modification 2

Figure 4:
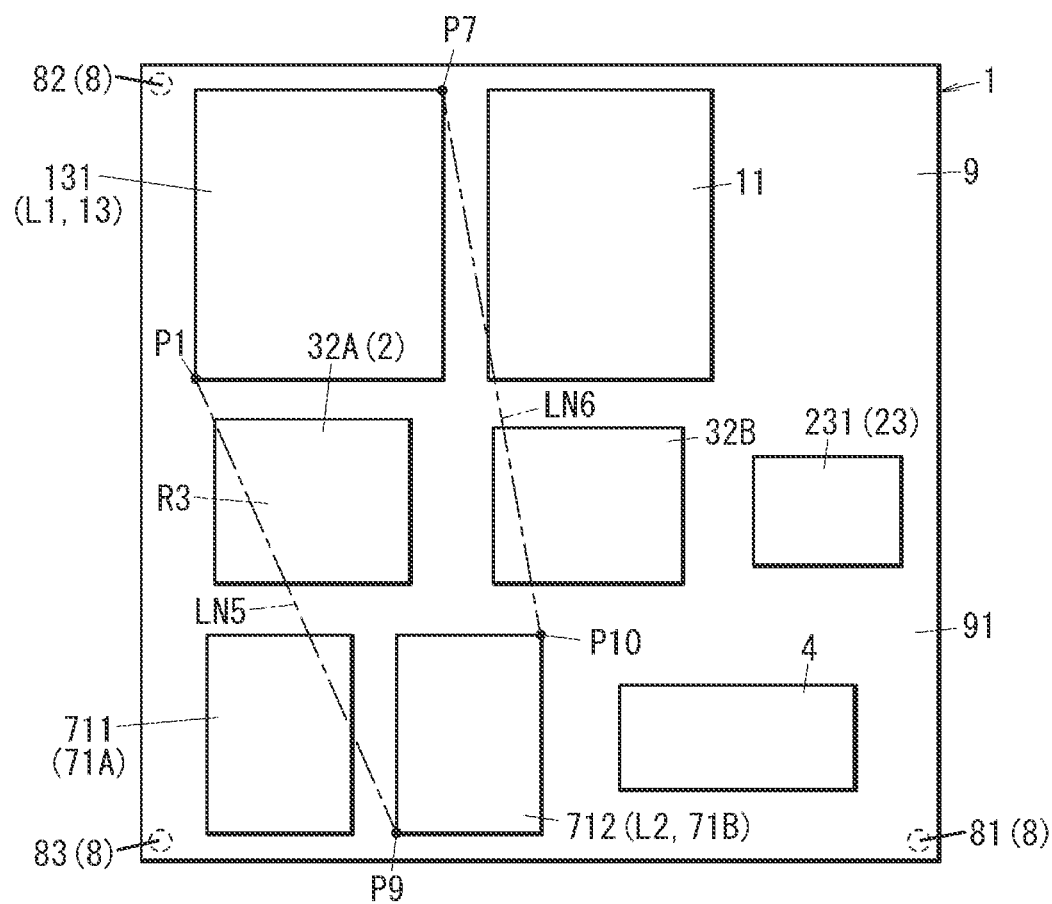
FIG. 4 is a plan view of the high-frequency module according to Modification 2 of Embodiment 1.

As illustrated in FIG. 4, the inductor 712 of the matching circuit 71B may be the second inductor L2. Hereinafter, the high-frequency module 1 according to Modification 2 will be described with reference to FIG. 4. Note that the configuration of the high-frequency module 1 according to Modification 2 is the same as the configuration of the high-frequency module 1 according to Embodiment 1. The same components are denoted by the same reference numerals, and the description thereof is omitted.

As illustrated in FIG. 4, in the high-frequency module 1 according to Modification 2, the duplexer 32A is located between the inductor 131 of the output matching circuit 13 and the inductor 712 of the matching circuit 71B. That is, in the high-frequency module 1 according to Modification 2, the duplexer 32A is the high-frequency component 2, the inductor 131 is the first inductor L1, and the inductor 712 is the second inductor L2.

In the example in FIG. 4, at least part of the duplexer 32A is located in a region R3 defined by two lines LN5 and LN6. The line LN5 is a line connecting the point P1 of the inductor 131 and a point P9 of the inductor 712. The line LN6 is a line connecting the point P7 of the inductor 131 and a point P10 of the inductor 712.

In addition, in the high-frequency module 1 according to Modification 2, the conductive member 20 electrically connected to the shield layer 103 is disposed between the high-frequency component 2 and the shield layer 103 in the depth direction D1 of the mounting substrate 9. The coupling between the first inductor L1 and the second inductor L2 may thereby be diminished.

In addition, in the high-frequency module 1 according to Modification 2, the conductive member 20 is connected to the first main surface 321 of the high-frequency component 2 (duplexer 32A). The layout area of the mounting substrate 9 may thus be ensured as compared with the case where the conductive member 20 is connected to the first main surface 91 of the mounting substrate 9. That is, with the high-frequency module 1 according to Modification 2, the coupling between the first inductor L1 and the second inductor L2 may be restrained, and the layout area of the mounting substrate 9 may also be ensured.

(8.3) Modification 3

Figure 5:
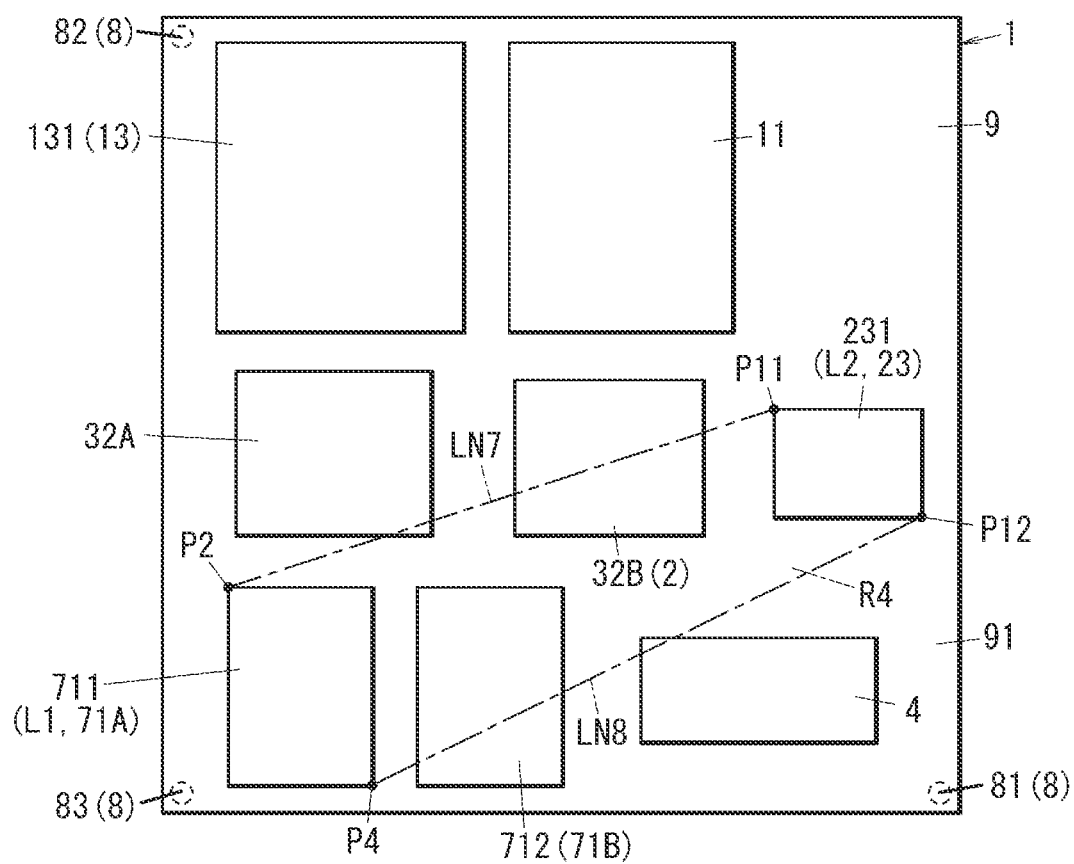
FIG. 5 is a plan view of the high-frequency module according to Modification 3 of Embodiment 1.

As illustrated in FIG. 5, the inductor 711 of the matching circuit 71A may be the first inductor L1. Hereinafter, the high-frequency module 1 according to Modification 3 will be described with reference to FIG. 5. Note that the configuration of the high-frequency module 1 according to Modification 3 is the same as the configuration of the high-frequency module 1 according to Modification 1. The same components are denoted by the same reference numerals, and the description thereof is omitted.

As illustrated in FIG. 5, in the high-frequency module 1 according to Modification 3, the duplexer 32B is located between the inductor 711 of the matching circuit 71A and the inductor 231 of the input matching circuit 23. That is, in the high-frequency module 1 according to Modification 3, the duplexer 32B is the high-frequency component 2, the inductor 711 is the first inductor L1, and the inductor 231 is the second inductor L2.

In the example in FIG. 5, at least part of the duplexer 32B is located in a region R4 defined by two lines LN7 and LN8. The line LN7 is a line connecting the point P2 of the inductor 711 and a point P11 of the inductor 231. The line LN8 is a line connecting the point P4 of the inductor 711 and a point P12 of the inductor 231.

In addition, in the high-frequency module 1 according to Modification 3, the conductive members 20 electrically connected to the shield layer 103 are disposed between the high-frequency component 2 and the shield layer 103 in the depth direction D1 of the mounting substrate 9. The coupling between the first inductor L1 and the second inductor L2 may thereby be diminished.

In addition, in the high-frequency module 1 according to Modification 3, the conductive members 20 are connected to the first main surface 321 of the high-frequency component 2 (duplexer 32B). The layout area of the mounting substrate 9 may thus be ensured as compared with the case where the conductive member 20 is connected to the first main surface 91 of the mounting substrate 9. That is, with the high-frequency module 1 according to Modification 3, the coupling between the first inductor L1 and the second inductor L2 may be restrained, and the layout area of the mounting substrate 9 may also be ensured.

(8.4) Modification 4

Figure 6:
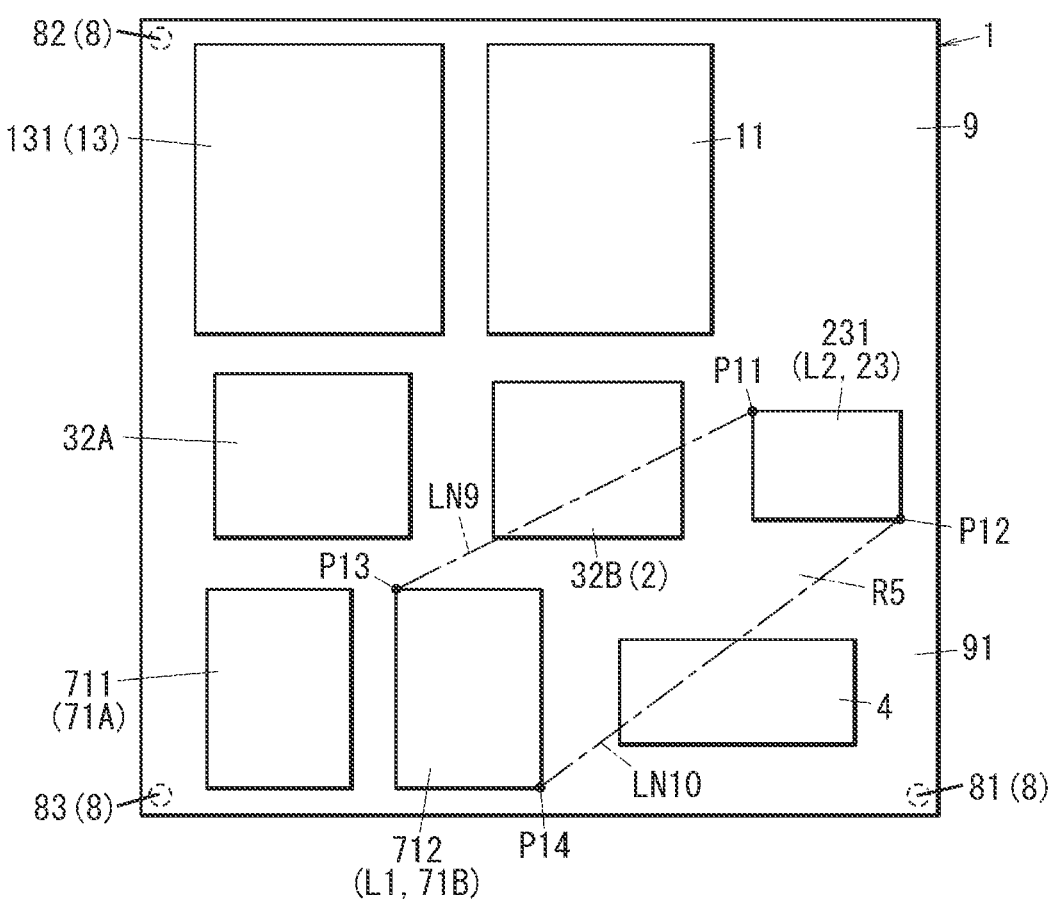
FIG. 6 is a plan view of the high-frequency module according to Modification 4 of Embodiment 1.

As illustrated in FIG. 6, the inductor 712 of the matching circuit 71B may be the first inductor L1. Hereinafter, the high-frequency module 1 according to Modification 4 will be described with reference to FIG. 6. Note that the configuration of the high-frequency module 1 according to Modification 4 is the same as the configuration of the high-frequency module 1 according to Modification 1. The same components are denoted by the same reference numerals, and the description thereof is omitted.

As illustrated in FIG. 6, in the high-frequency module 1 according to Modification 4, the duplexer 32B is located between the inductor 712 of the matching circuit 71B and the inductor 231 of the input matching circuit 23. That is, in the high-frequency module 1 according to Modification 4, the duplexer 32B is the high-frequency component 2, the inductor 712 is the first inductor L1, and the inductor 231 is the second inductor L2.

In the example in FIG. 6, at least part of the duplexer 32B is located in a region R5 defined by two lines LN9 and LN10. The line LN9 is a line connecting a point P13 of the inductor 712 and the point P11 of the inductor 231. The line LN10 is a line connecting a point P14 of the inductor 712 and the point P12 of the inductor 231.

In addition, in the high-frequency module 1 according to Modification 4, the conductive members 20 electrically connected to the shield layer 103 are disposed between the high-frequency component 2 and the shield layer 103 in the depth direction D1 of the mounting substrate 9. The coupling between the first inductor L1 and the second inductor L2 may thereby be diminished.

In addition, in the high-frequency module 1 according to Modification 4, the conductive members 20 are connected to the first main surface 321 of the high-frequency component 2 (duplexer 32B). The layout area of the mounting substrate 9 may thus be ensured as compared with the case where the conductive member 20 is connected to the first main surface 91 of the mounting substrate 9. That is, with the high-frequency module 1 according to Modification 4, the coupling between the first inductor L1 and the second inductor L2 may be restrained, and the layout area of the mounting substrate 9 may also be ensured.

(8.5) Modification 5

Figure 7:
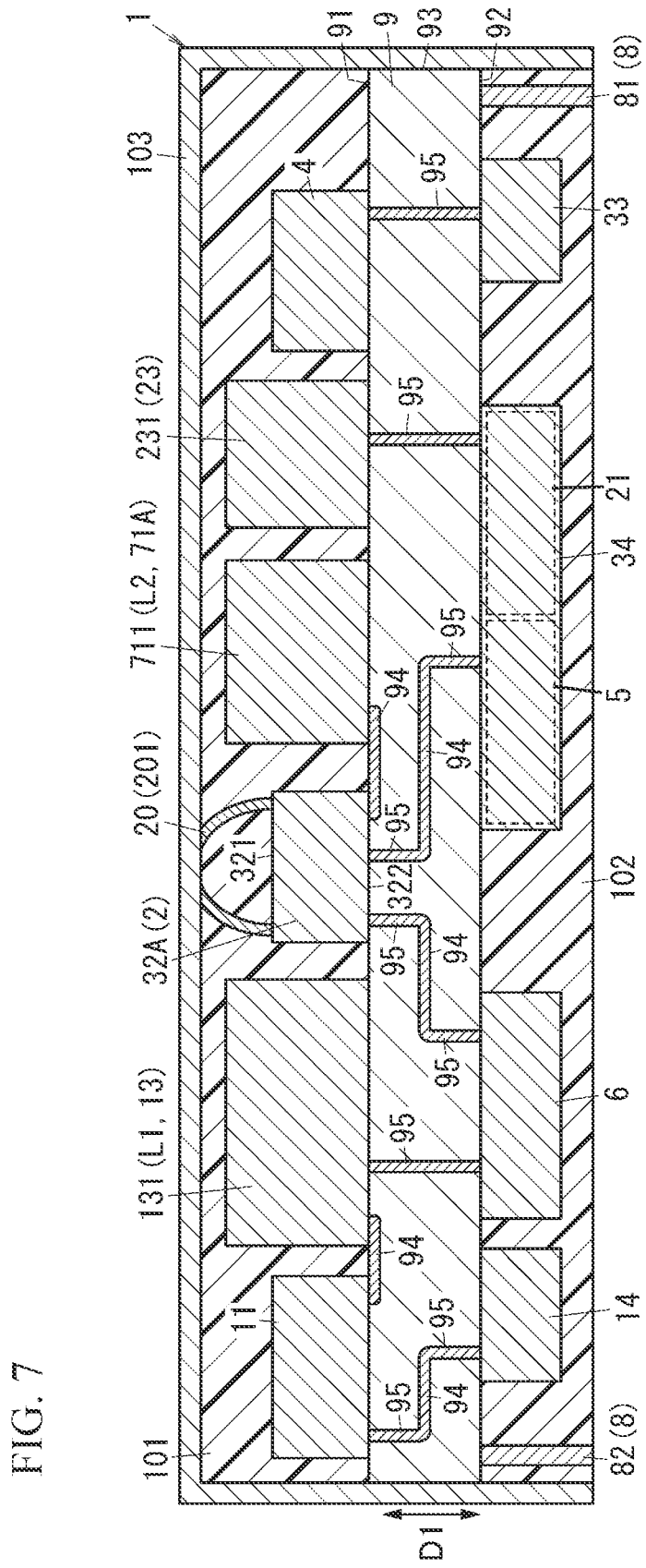
FIG. 7 is a cross-sectional view of the high-frequency module according to Modification 5 of Embodiment 1.

FIG. 7 is a cross-sectional view of the high-frequency module 1 according to Modification 5.

As illustrated in FIG. 7, in the high-frequency module 1 according to Modification 5, the power amplifier 11, the inductor 131 of the output matching circuit 13, the duplexer 32A, the inductor 711 of the matching circuit 71A, the inductor 231 of the input matching circuit 23, and the first switch 4 are located on the first main surface 91 of the mounting substrate 9. In addition, in the high-frequency module 1 according to Modification 5, the controller 14, the third switch 6, an IC chip 34, and the filter 33 are located on the second main surface 92 of the mounting substrate 9. Further, the plurality of (two, in the illustrated example) external connection terminals 8 are located on the second main surface 92 of the mounting substrate 9. The IC chip 34 includes the second switch 5 and the low-noise amplifier 21. The plurality of external connection terminals 8 include the antenna terminal 81 and the input terminal 82. The conductive member 20 is, for example, the conductive wire 201.

In the high-frequency module 1 according to Modification 5, the duplexer 32A is located between the inductor 131 of the output matching circuit 13 and the inductor 711 of the matching circuit 71A, but the illustration of this layout is omitted. That is, in the high-frequency module 1 according to Modification 5, the duplexer 32A is the high-frequency component 2, the inductor 131 is the first inductor L1, and the inductor 711 is the second inductor L2.

In addition, in the high-frequency module 1 according to Modification 5, the conductive member 20 (conductive wire 201) electrically connected to the shield layer 103 is disposed between the high-frequency component 2 (duplexer 32A) and the shield layer 103 in the depth direction D1 of the mounting substrate 9. The coupling between the first inductor L1 and the second inductor L2 may thereby be diminished.

In addition, in the high-frequency module 1 according to Modification 5, the conductive member 20 (conductive wire 201) is connected to the first main surface 321 of the high-frequency component 2 (duplexer 32A). The layout area of the mounting substrate 9 may thus be ensured as compared with the case where the conductive member 20 is connected to the first main surface 91 of the mounting substrate 9. That is, with the high-frequency module 1 according to Modification 5, the coupling between the first inductor L1 and the second inductor L2 may be restrained, and the layout area of the mounting substrate 9 may also be ensured.

Further, as illustrated in FIG. 7, in the high-frequency module 1 according to Modification 5, the IC chip 34 including the low-noise amplifier 21 overlaps with at least part of the duplexer 32A serving as the high-frequency component 2 in the depth direction D1 of the mounting substrate 9. A path from the high-frequency component 2 to the IC chip 34 may thus be shortened.

In addition, in the high-frequency module 1 according to Modification 5, the power amplifier 11 overlaps with the controller 14 in the depth direction D1 of the mounting substrate 9. A path from the controller 14 to the power amplifier 11 may thus be shortened. Further, in the high-frequency module 1 according to Modification 5, the IC chip 34 including the low-noise amplifier 21 overlaps with the inductor 231 of the input matching circuit 23 in the depth direction D1 of the mounting substrate 9. A path from the inductor 231 to the IC chip 34 may thus be shortened.

(8.6) Modification 6

Figure 8:
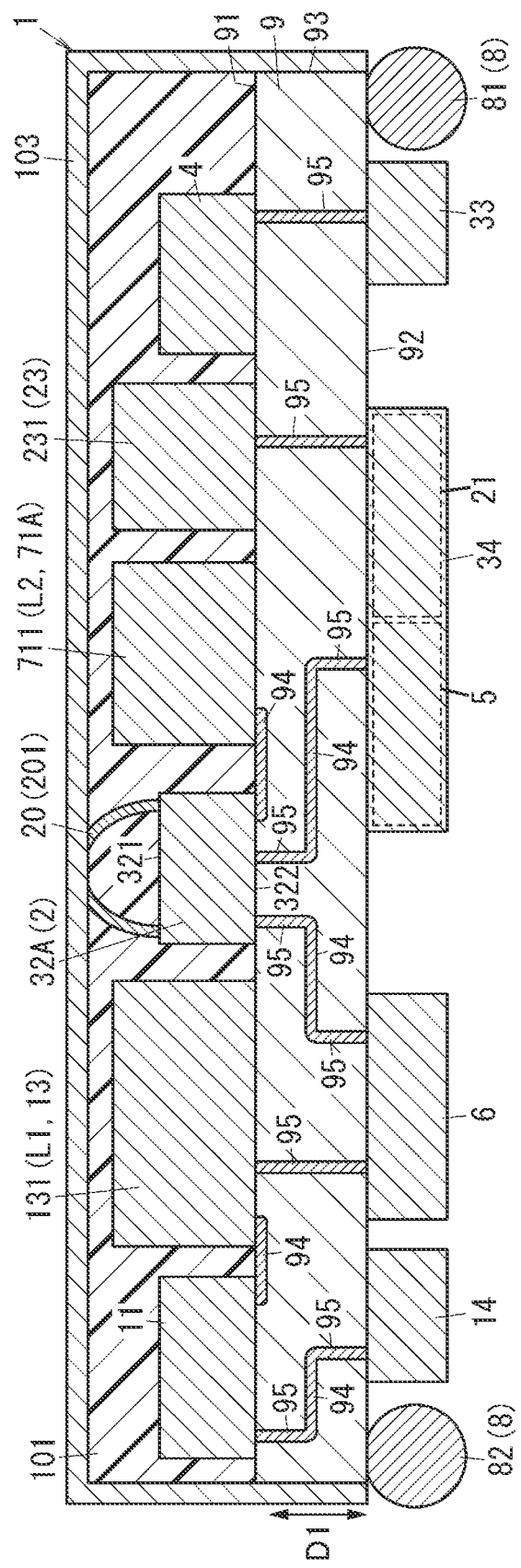
FIG. 8 is a cross-sectional view of the high-frequency module according to Modification 6 of Embodiment 1.

FIG. 8 is a cross-sectional view of the high-frequency module 1 according to Modification 6.

The high-frequency module 1 according to Modification 6 is different from the high-frequency module 1 according to Embodiment 1 in that the plurality of external connection terminals 8 are ball bumps. The high-frequency module 1 according to Modification 6 is also different from the high-frequency module 1 according to Embodiment 1 in that the high-frequency module 1 according to Modification 6 does not include the second resin layer 102 in the high-frequency module 1 according to Embodiment 1. The high-frequency module 1 according to Modification 6 may include an underfill portion disposed in a gap between the second main surface 92 of the mounting substrate 9 and each of the controller 14, the third switch 6, the IC chip 34, and the filter 33.

The material of each ball bump serving as a corresponding one of the plurality of external connection terminals 8 is, for example, gold, copper, or solder.

In the plurality of external connection terminals 8, an external connection terminal 8 serving as the ball bump and an external connection terminal 8 serving as the columnar electrode may coexist.

(8.7) Modification 7

The high-frequency module 1 according to Modification 7 is different from the high-frequency module 1 according to Embodiment 1 in that the conductive member 20 connecting the high-frequency component 2 and the shield layer 103 is a conductive pillar 202. Hereinafter, the high-frequency module 1 according to Modification 7 will be described with reference to FIG. 9A.

Figure 9A:
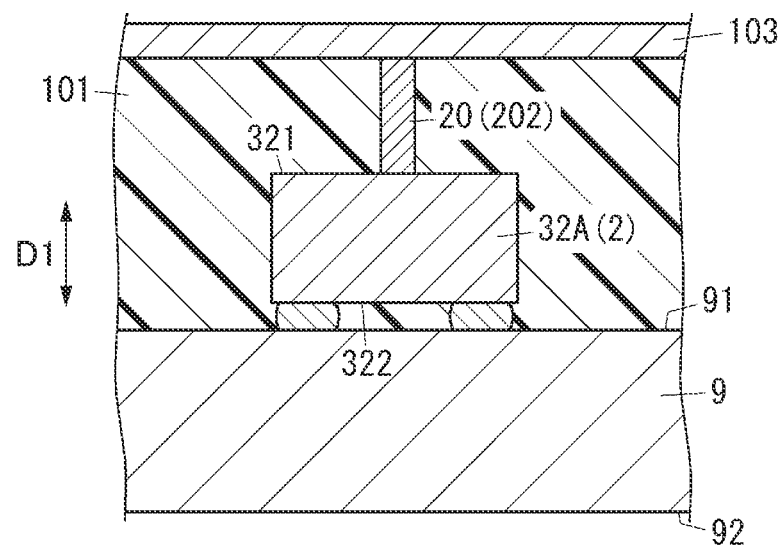
FIG. 9A is a cross-sectional view of a chief part of the high-frequency module according to Modification 7 of Embodiment 1.

In the high-frequency module 1 according to Modification 7, the duplexer 32A located on the first main surface 91 side of the mounting substrate 9 is the high-frequency component 2. In addition, as illustrated in FIG. 9A, the conductive pillar 202 serving as the conductive member 20 is disposed between the duplexer 32A and the shield layer 103 in the depth direction D1 of the mounting substrate 9. The conductive pillar 202 is also connected to the first main surface 321 of the duplexer 32A. Further, the conductive pillar 202 is electrically connected to the shield layer 103.

In the high-frequency module 1 according to Modification 7, the high-frequency component 2 is located between the first inductor L1 and the second inductor L2, but the illustration of this layout is omitted. In addition, in the high-frequency module 1 according to Modification 7, the conductive pillar 202 electrically connected to the shield layer 103 is disposed between the duplexer 32A and the shield layer 103 in the depth direction D1 of the mounting substrate 9. The coupling between the first inductor L1 and the second inductor L2 may thereby be diminished.

In addition, in the high-frequency module 1 according to Modification 7, the conductive member 20 (conductive pillar 202) is connected to the first main surface 321 of the high-frequency component 2 (duplexer 32A). The layout area of the mounting substrate 9 may thus be ensured as compared with the case where the conductive member 20 is connected to the first main surface 91 of the mounting substrate 9. That is, with the high-frequency module 1 according to Modification 7, the coupling between the first inductor L1 and the second inductor L2 may be restrained, and the layout area of the mounting substrate 9 may also be ensured.

(8.8) Modification 8

The high-frequency module 1 according to Modification 8 is different from the high-frequency module 1 according to Embodiment 1 in that the conductive member 20 connecting the high-frequency component 2 and the shield layer 103 is a metal block 203. Hereinafter, the high-frequency module 1 according to Modification 8 will be described with reference to FIG. 9B.

Figure 9B:
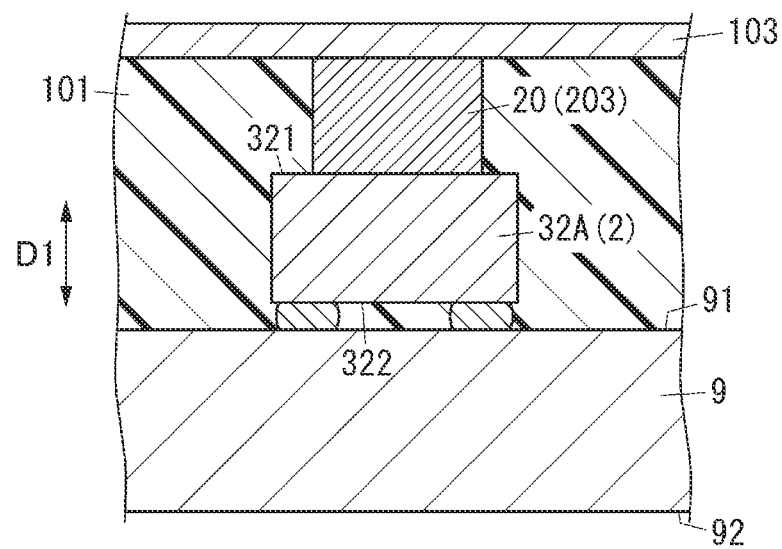
FIG. 9B is a cross-sectional view of a chief part of the high-frequency module according to Modification 8 of Embodiment 1.

In the high-frequency module 1 according to Modification 8, the duplexer 32A located on the first main surface 91 side of the mounting substrate 9 is the high-frequency component 2. In addition, as illustrated in FIG. 9B, the metal block 203 serving as the conductive member 20 is disposed between the duplexer 32A and the shield layer 103 in the depth direction D1 of the mounting substrate 9. The metal block 203 is also connected to the first main surface 321 of the duplexer 32A. Further, the metal block 203 is electrically connected to the shield layer 103.

In the high-frequency module 1 according to Modification 8, the high-frequency component 2 is located between the first inductor L1 and the second inductor L2, but the illustration of this layout is omitted. In addition, in the high-frequency module 1 according to Modification 8, the metal block 203 electrically connected to the shield layer 103 is disposed between the duplexer 32A and the shield layer 103 in the depth direction D1 of the mounting substrate 9. The coupling between the first inductor L1 and the second inductor L2 may thereby be diminished.

In addition, in the high-frequency module 1 according to Modification 8, the conductive member 20 (metal block 203) is connected to the first main surface 321 of the high-frequency component 2 (duplexer 32A). The layout area of the mounting substrate 9 may thus be ensured as compared with the case where the conductive member 20 is connected to the first main surface 91 of the mounting substrate 9. That is, with the high-frequency module 1 according to Modification 8, the coupling between the first inductor L1 and the second inductor L2 may be restrained, and the layout area of the mounting substrate 9 may also be ensured.

(8.9) Modification 9

The high-frequency module 1 according to Modification 9 is different from the high-frequency module 1 according to Embodiment 1 in that the conductive member 20 is electrically connected to the conductive pattern portion 94 of the mounting substrate 9 with a through-hole electrode 323 interposed therebetween. Hereinafter, the high-frequency module 1 according to Modification 9 will be described with reference to FIG. 10A.

Figure 10A:
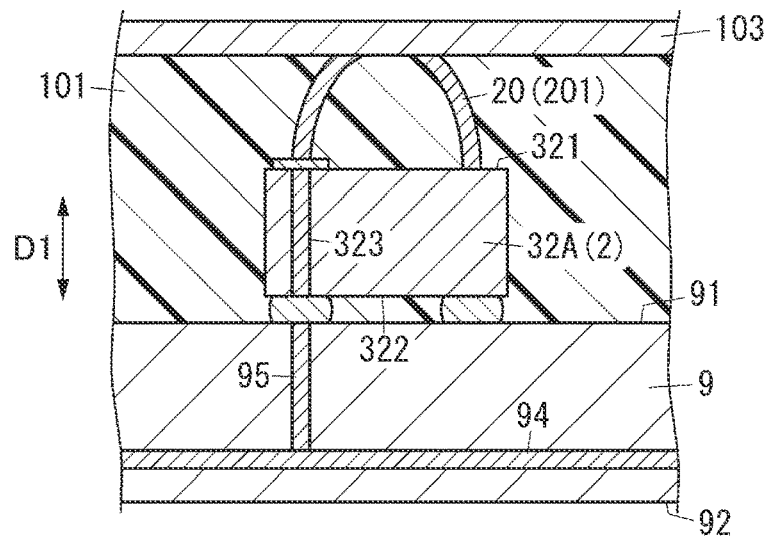
FIG. 10A is a cross-sectional view of a chief part of the high-frequency module according to Modification 9 of Embodiment 1.

As illustrated in FIG. 10A, in the high-frequency module 1 according to Modification 9, the duplexer 32A has the through-hole electrode 323. The through-hole electrode 323 penetrates the duplexer 32A in the depth direction of the duplexer 32A. As illustrated in FIG. 10A, the mounting substrate 9 also has the conductive pattern portion 94 and the columnar electrode 95. The potential of the conductive pattern portion 94 is set at the ground potential. The through-hole electrode 323 is electrically connected to the conductive pattern portion 94 with the columnar electrode 95 interposed therebetween.

In the high-frequency module 1 according to Modification 9, the conductive member 20 (conductive wire 201) is electrically connected to the shield layer 103 electrically connected to the ground. The conductive member 20 is also electrically connected to the through-hole electrode 323 of the duplexer 32A. Further, as described above, the through-hole electrode 323 is electrically connected to the conductive pattern portion 94 with the columnar electrode 95 interposed therebetween. The conductive member 20 is electrically connected to the ground with the through-hole electrode 323 and the columnar electrodes 95 interposed therebetween.

In the high-frequency module 1 according to Modification 9, the conductive member 20 is electrically connected to the ground with the shield layer 103 interposed therebetween and is also electrically connected to the ground (conductive pattern portion 94) with the through-hole electrode 323 and the columnar electrode 95 interposed therebetween. The coupling between the first inductor L1 and the second inductor L2 may thereby be restrained further.

(8.10) Modification 10

The high-frequency module 1 according to Modification 10 is different from the high-frequency module 1 according to Embodiment 1 in that the conductive member 20 is electrically connected to the conductive pattern portion 94 of the mounting substrate 9 with a side electrode 324 interposed therebetween. Hereinafter, the high-frequency module 1 according to Modification 10 will be described with reference to FIG. 10B.

Figure 10B:
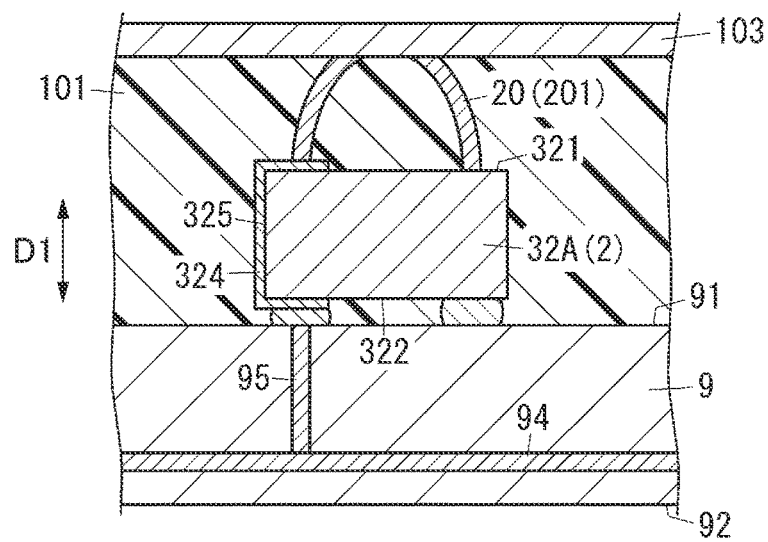
FIG. 10B is a cross-sectional view of a chief part of the high-frequency module according to Modification 10 of Embodiment 1.

As illustrated in FIG. 10B, in the high-frequency module 1 according to Modification 10, the duplexer 32A has the side electrode 324. The side electrode 324 is disposed on the first main surface 321, a side surface 325, and the second main surface 322 of the duplexer 32A. As illustrated in FIG. 10B, the mounting substrate 9 also has the conductive pattern portion 94 and the columnar electrode 95. The potential of the conductive pattern portion 94 is set at the ground potential. The side electrode 324 is electrically connected to the conductive pattern portion 94 with the columnar electrode 95 interposed therebetween.

In the high-frequency module 1 according to Modification 10, the conductive member 20 (conductive wire 201) is electrically connected to the shield layer 103 electrically connected to the ground. The conductive member 20 is also electrically connected to the side electrode 324 of the duplexer 32A. Further, as described above, the side electrode 324 is electrically connected to the conductive pattern portion 94 with the columnar electrode 95 interposed therebetween. The conductive member 20 is thus electrically connected to the ground with the side electrode 324 and the columnar electrode 95 interposed therebetween.

In the high-frequency module 1 according to Modification 10, the conductive member 20 is electrically connected to the ground with the shield layer 103 interposed therebetween and is also electrically connected to the ground (conductive pattern portion 94) with the side electrode 324 and the columnar electrode 95 interposed therebetween. The coupling between the first inductor L1 and the second inductor L2 may thereby be restrained further.

(8.11) Modification 11

The high-frequency module 1 according to Modification 11 is different from the high-frequency module 1 according to Embodiment 1 in that the conductive member 20 is electrically connected to the conductive pattern portion 94 of the mounting substrate 9 with a conductive wire 30 interposed therebetween. Hereinafter, the high-frequency module 1 according to Modification 11 will be described with reference to FIG. 10C.

Figure 10C:
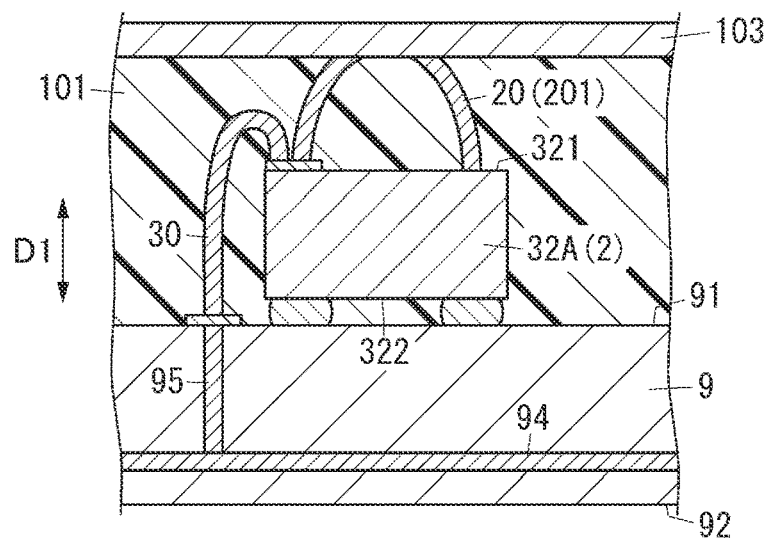
FIG. 10C is a cross-sectional view of a chief part of the high-frequency module according to Modification 11 of Embodiment 1.

As illustrated in FIG. 10C, in the high-frequency module 1 according to Modification 11, the mounting substrate 9 has the conductive pattern portion 94 and the columnar electrode 95. The potential of the conductive pattern portion 94 is set at the ground potential. In the high-frequency module 1 according to Modification 11, the conductive wire 201 serving as the conductive member 20 is electrically connected to the columnar electrode 95 with the conductive wire 30 interposed therebetween. The conductive wire 201 is thereby electrically connected to the ground (conductive pattern portion 94) with the conductive wire 30 and the columnar electrode 95 interposed therebetween. The conductive wire 201 is also electrically connected to the shield layer 103 electrically connected to the ground.

In the high-frequency module 1 according to Modification 11, the conductive member 20 is electrically connected to the ground with the shield layer 103 interposed therebetween and is also electrically connected to the ground (conductive pattern portion 94) with the conductive wire 30 and the columnar electrode 95 interposed therebetween. The coupling between the first inductor L1 and the second inductor L2 may thereby be restrained further.

(8.12) Modification 12

The high-frequency module 1 according to Modification 12 is different from the high-frequency module 1 according to Embodiment 1 in that the conductive wire 201 connects a plurality of (two, in the illustrated example) high-frequency components 2. Hereinafter, the high-frequency module 1 according to Modification 12 will be described with reference to FIG. 11.

Figure 11:
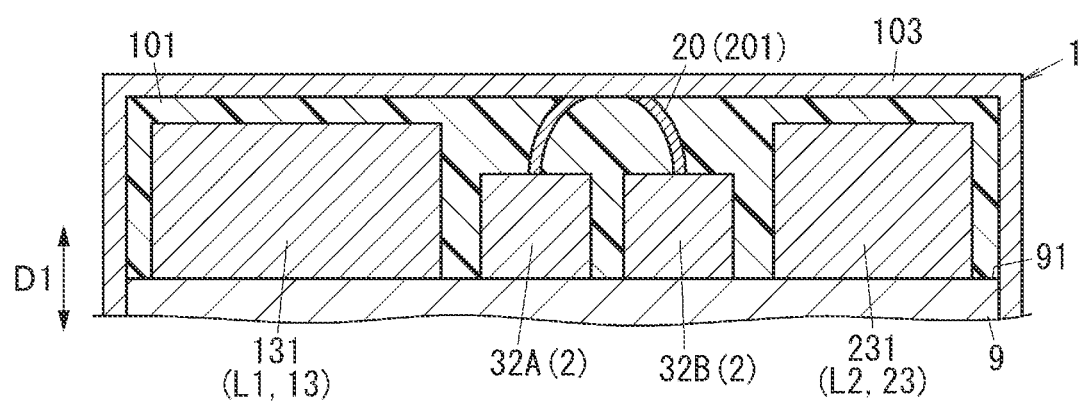
FIG. 11 is a cross-sectional view of a chief part of the high-frequency module according to Modification 12 of Embodiment 1.

As illustrated in FIG. 11, the high-frequency module 1 according to Modification 12 includes the duplexers 32A and 32B as the plurality of (two, in the illustrated example) high-frequency components 2. The duplexers 32A and 32B are located between the inductor 131 of the output matching circuit 13 and the inductor 231 of the input matching circuit 23. That is, in the high-frequency module 1 according to Modification 12, the inductor 131 is the first inductor L1, and the inductor 231 is the second inductor L2.

As illustrated in FIG. 11, in the high-frequency module 1 according to Modification 12, the conductive wire 201 serving as the conductive member 20 is disposed in such a manner as to extend over both of the two duplexers 32A and 32B. The conductive wire 201 is also electrically connected to the shield layer 103 electrically connected to the ground.

In the high-frequency module 1 according to Modification 12, as described above, the conductive member 20 is disposed in such a manner as to extend over the plurality of high-frequency components 2. The coupling between the first inductor L1 and the second inductor L2 may thereby be restrained.

(8.13) Other Modifications

Embodiment 1 is only one of various embodiments of the present disclosure. Various changes may be made to Embodiment 1 in designing or the like as long as the possible benefit of the present disclosure is achievable.

The mounting substrate 9 is not limited to the printed-circuit board plate or the LTCC substrate and may be, for example, a high temperature co-fired ceramics (HTCC) substrate or a substrate having components built therein.

It suffices that the number of selective terminals of each of the first switch 4, the second switch 5, and the third switch 6 may be plural, and the number is not limited to the exemplified number.

The second switch 5 and the third switch 6 may be formed as one chip.

The first switch 4, the second switch 5, and the third switch 6 may each be controlled in accordance with, for example, a control signal from the RF-signal processing circuit 302 of the signal processing circuit 301 instead of being controlled by the controller 14.

The transmission filters 12A and 12B and the reception filters 22A and 22B are each an acoustic wave filter using a surface acoustic wave but are not limited to these. The transmission filters 12A and 12B and the reception filters 22A and 22B may each be, for example, an acoustic wave filter using a boundary acoustic wave, a plate wave, or the like.

In the acoustic wave filter, each of the plurality of serial arm resonators and the plurality of parallel arm resonators is not limited to a SAW resonator and may be, for example, a bulk acoustic wave (BAW) resonator.

The high-frequency component 2 is the duplexer 32A but is not limited to this. The high-frequency component 2 may be, for example, at least one of the transmission filters 12A and 12B or may be at least one of the reception filters 22A and 22B. The high-frequency component 2 may also be, for example, a diplexer including the filter 33. Further, the high-frequency component 2 may also be, for example, a LC filter.

A plurality of conductive members 20 may be provided. In this case, and the plurality of conductive members 20 may include at least one conductive wire 201, at least one conductive pillar 202, and at least one metal block 203.

In Modification 5, the controller 14 is located (mounted) on the second main surface 92 side of the mounting substrate 9; however, the controller 14 may be located (mounted), for example, on the first main surface 91 side of the mounting substrate 9 and adjacent to the power amplifier 11.

It suffices that the height H1 of the high-frequency component 2 is lower than at least one of the height H2 of the first inductor L1 and the height H3 of the second inductor L2. That is, the height H1 of the high-frequency component 2 may be higher than the height H2 of the first inductor L1 and may be lower than the height H3 of the second inductor L2. Alternatively, the height H1 of the high-frequency component 2 may be lower than the height H2 of the first inductor L1 and may be higher than the height H3 of the second inductor L2.

Embodiment 2

Figure 12A:
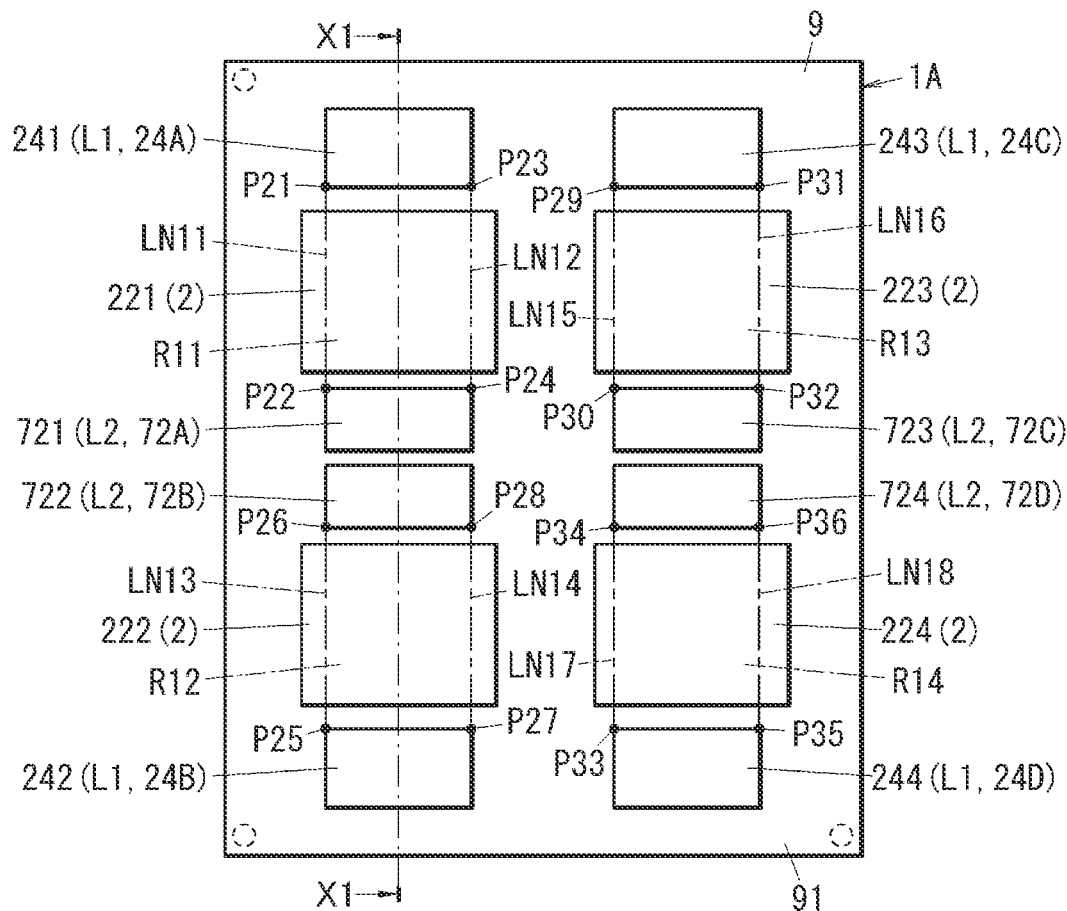
FIG. 12A is a plan view of a high-frequency module according to Embodiment 2.
Figure 12B:
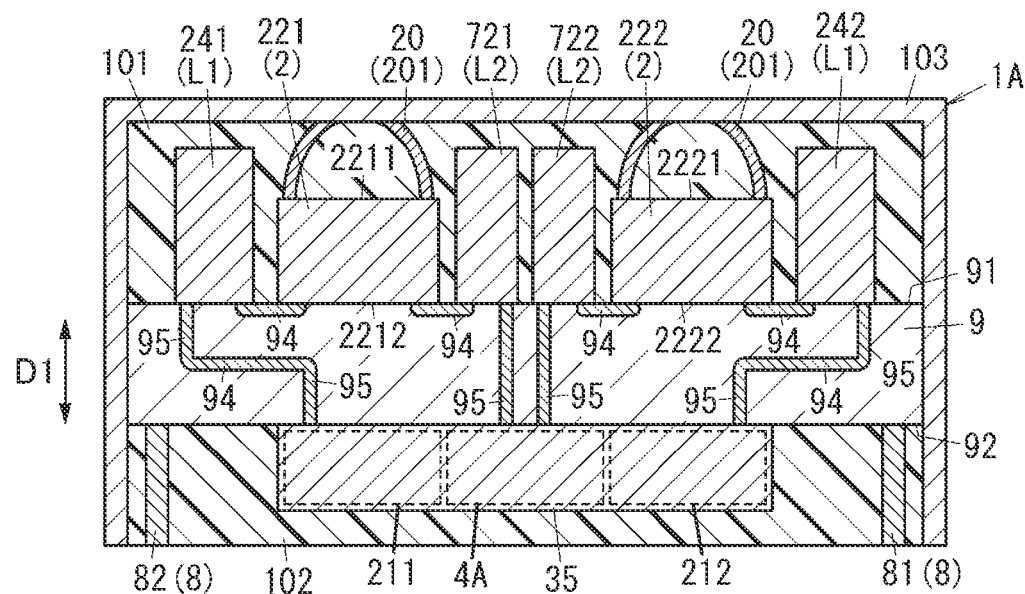
FIG. 12B is a cross-sectional view taken along the X1-X1 line in FIG. 12A.

As illustrated in FIGS. 12A and 12B, a high-frequency module 1A according to Embodiment 2 is different from the high-frequency module 1 according to Embodiment 1 in that the high-frequency module 1A has only the reception function. Note that for the high-frequency module 1A according to Embodiment 2, the same components as those in the high-frequency module 1 according to Embodiment 1 are denoted by the same reference numerals, and the description thereof is omitted.

(1) Configuration

As illustrated in FIGS. 12A and 12B, the high-frequency module 1A according to Embodiment 2 includes a plurality of (four, in the illustrated example) reception filters 221 to 224, a plurality of (four, in the illustrated example) input matching circuits 24A to 24D, and a plurality of (four, and in the illustrated example) matching circuits 72A to 72D. The high-frequency module 1A also includes a chip IC 35 and the plurality of (two, in the illustrated example) external connection terminals 8. Further, as illustrated in FIGS. 12A and 12B, the high-frequency module 1A includes the mounting substrate 9, the first resin layer 101, the second resin layer 102, the shield layer 103, and the plurality of (two, in the illustrated example) conductive members 20. The chip IC 35 includes a plurality of (two, in the illustrated example) low-noise amplifiers 211 and 212 and a first switch 4A. The plurality of conductive members 20 each include, for example, the conductive wire 201.

The plurality of reception filters 221 to 224, inductors 241 to 244 of the plurality of respective input matching circuits 24A to 24D, and inductors 721 to 724 of the plurality of respective matching circuits 72A to 72D are located on the first main surface 91 side of the mounting substrate 9. The IC chip 35 is located on the second main surface 92 side of the mounting substrate 9.

In the IC chip 35, the first switch 4A is located between the low-noise amplifier 211 and the low-noise amplifier 212. Isolation between communication through the first reception path including the low-noise amplifier 211 and communication through the second reception path including the low-noise amplifier 212 may thereby be enhanced.

As illustrated in FIG. 12A, in the high-frequency module 1A according to Embodiment 2, the reception filter 221 is located between the inductor 241 of the input matching circuit 24A and the inductor 721 of the matching circuit 72A. In addition, in the high-frequency module 1A, the reception filter 222 is located between the inductor 242 of the input matching circuit 24B and the inductor 722 of the matching circuit 72B. In addition, in the high-frequency module 1A, the reception filter 223 is located between the inductor 243 of the input matching circuit 24C and the inductor 723 of the matching circuit 72C. In addition, in the high-frequency module 1A, the reception filter 224 is located between the inductor 244 of the input matching circuit 24D and the inductor 724 of the matching circuit 72D. That is, in the high-frequency module 1A according to Embodiment 2, the plurality of reception filters 221 to 224 are each the high-frequency component 2, the plurality of inductors 241 to 244 are each the first inductor L1, and the plurality of inductors 721 to 724 are each the second inductor L2.

At least part of the reception filter 221 is located in a region R11 defined by two lines LN11 and LN12. The line LN11 is a line connecting a point P21 of the inductor 241 and a point P22 of the inductor 721. The line LN12 is a line connecting a point P23 of the inductor 241 and a point P24 of the inductor 721.

At least part of the reception filter 222 is located in a region R12 defined by two lines LN13 and LN14. The line LN13 is a line connecting a point P25 of the inductor 242 and a point P26 of the inductor 722. The line LN14 is a line connecting a point P27 of the inductor 242 and a point P28 of the inductor 722.

At least part of the reception filter 223 is located in a region R13 defined by two lines LN15 and LN16. The line LN15 is a line connecting a point P29 of the inductor 243 and a point P30 of the inductor 723. The line LN16 is a line connecting a point P31 of the inductor 243 and a point P32 of the inductor 723.

At least part of the reception filter 224 is located in a region R14 defined by two lines LN17 and LN18. The line LN17 is a line connecting a point P33 of the inductor 244 and a point P34 of the inductor 724. The line LN18 is a line connecting a point P35 of the inductor 244 and a point P36 of the inductor 724.

In addition, in the high-frequency module 1A according to Embodiment 2, one of the plurality of conductive wires 201 is disposed between the reception filter 221 and the shield layer 103 in the depth direction D1 of the mounting substrate 9 and is also connected to a first main surface 2211 of the reception filter 221. The other one of the plurality of conductive wires 201 is disposed between the reception filter 222 and the shield layer 103 in the depth direction D1 of the mounting substrate 9 and is also connected to a first main surface 2221 of the reception filter 222. Note that the illustration of a conductive member between the reception filter 223 and the shield layer 103 and a conductive member between the reception filter 224 and the shield layer 103 is omitted but is the same as those of the reception filters 221 and 222.

(2) Advantageous Effects

In the high-frequency module 1A according to Embodiment 2, each of the high-frequency components 2 is located between the first inductor L1 and the second inductor L2. In addition, in the high-frequency module 1A, each of the conductive members 20 electrically connected to the shield layer 103 is disposed between a corresponding one of the high-frequency components 2 and the shield layer 103 in the depth direction D1 of the mounting substrate 9. The coupling between the first inductor L1 and the second inductor L2 may thereby be diminished.

In addition, in the high-frequency module 1A according to Embodiment 2, each conductive member 20 is connected to the first main surface 321 of the high-frequency component 2. The layout area of the mounting substrate 9 may thus be ensured as compared with the case where the conductive member 20 is connected to the first main surface 91 of the mounting substrate 9. That is, with the high-frequency module 1A according to Embodiment 2, the coupling between the first inductor L1 and the second inductor L2 may be restrained, and the layout area of the mounting substrate 9 may also be ensured.

(3) Modification

In a modification of Embodiment 2, each modification of Embodiment 1 may be applied to the high-frequency module 1A according to Embodiment 2. The same advantageous effects as those of the high-frequency module 1A according to Embodiment 2 are also exerted in the high-frequency module 1 according to the modification.

The embodiments and the modifications described above are merely part of various embodiments and modifications of the present disclosure. Various changes may be made to the embodiments and the modifications in designing or the like as long as the possible benefit of the present disclosure is achievable.

(Aspects)

This specification discloses the following aspects.

A high-frequency module (1 or 1A) according to a first aspect includes a mounting substrate (9), a first inductor (L1), a second inductor (L2), at least one high-frequency component (2), a shield layer (103), and a conductive member (20). The mounting substrate (9) has a main surface (91). The first inductor (L1) is located on the main surface (91) side of the mounting substrate (9). The second inductor (L2) is located on the main surface (91) side of the mounting substrate (9). The high-frequency component (2) is located on the main surface (91) side of the mounting substrate (9) and between the first inductor (L1) and the second inductor (L2). The shield layer (103) is connected to the ground. The conductive member (20) connects the high-frequency component (2) and the shield layer (103). The conductive member (20) is connected to a main surface (321) opposite from the shield layer (103) in the high-frequency component (2).

According to this aspect, with the conductive member (20) electrically connected to the shield layer (103), the coupling between the first inductor (L1) and the second inductor (L2) may be diminished. In addition, since the conductive member (20) is connected to the main surface (321) of the high-frequency component (2), the layout area of the mounting substrate (9) may be ensured as compared with the case where the conductive member (20) is connected to the mounting substrate (9) having the high-frequency component (2) mounted thereon. That is, according to this aspect, the coupling between the first inductor (L1) and the second inductor (L2) may be restrained, and the layout area of the mounting substrate (9) may also be ensured.

In the first aspect, in the high-frequency module (1 or 1A) according to a second aspect, the conductive member (20) includes a conductive wire (201).

According to this aspect, mounting at a high density (narrow-pitch or minimal land mounting) may be performed.

In the second aspect, the high-frequency module (1 or 1A) according to a third aspect includes a plurality of high-frequency components (2). The conductive member (20) is connected to the plurality of high-frequency components (2).

According to this aspect, the coupling between the first inductor (L1) and the second inductor (L2) may be restrained.

In one of the first to third aspects, in the high-frequency module (1 or 1A) according to a fourth aspect, the conductive member (20) includes a conductive pillar (202).

In one of the first to fourth aspects, in the high-frequency module (1 or 1A) according to a fifth aspect, the conductive member (20) includes a metal block (203).

In one of the first to fifth aspects, in the high-frequency module (1 or 1A) according to a sixth aspect, in a depth direction (D1) of the mounting substrate (9), a height (H1) of the high-frequency component (2) is lower than at least one of a height (H2) of the first inductor (L1) and a height (H3) of the second inductor (L2).

According to this aspect, the high-frequency module (1 or 1A) may be made shorter.

In the sixth aspect, in the high-frequency module (1 or 1A) according to a seventh aspect, in the depth direction (D1) of the mounting substrate (9), the height (H1) of the high-frequency component (2) is lower than each of the height (H2) of the first inductor (L1) and the height (H3) of and the second inductor (L2).

According to this aspect, the high-frequency module (1 or 1A) may be made shorter.

In one of the first to seventh aspects, the high-frequency module (1 or 1A) according to an eighth aspect further includes a resin layer (101). The resin layer (101) is disposed between the high-frequency component (2) and the shield layer (103).

According to this aspect, the conductive member (20) may be supported with the resin layer (101).

In one of the first to eighth aspects, in the high-frequency module (1 or 1A) according to a ninth aspect, the high-frequency component (2) is a reception filter (22A or 22B), a transmission filter (12A or 12B), or a duplexer (32A or 32B). The reception filter (22A or 22B) allows a reception signal from an antenna (310) to pass therethrough. The transmission filter (12A or 12B) allows a transmission signal to the antenna (310) to pass therethrough. The duplexer (32A or 32B) includes both of the reception filter (22A or 22B) and the transmission filter (12A or 12B).

In one of the first to ninth aspects, in the high-frequency module (1 or 1A) according to a tenth aspect, the first inductor (L1) is a first matching inductor (131), a second matching inductor (231), or a third matching inductor (711 or 712). The first matching inductor (131) is disposed on a signal path between the high-frequency component (2) and a power amplifier (11) that amplifies the transmission signal to the antenna (310) (on a transmission path T1). The second matching inductor (231) is disposed on a signal path between the high-frequency component (2) and a low-noise amplifier (21) that amplifies the reception signal from the antenna (310) (on a reception path T2). The third matching inductor (711 or 712) is disposed on a signal path between the high-frequency component (2) and the antenna (310) (on the transmission path T1 or the reception path T2). The second inductor (L2) is the first matching inductor (131), the second matching inductor (231), or the third matching inductor (711 or 712) and is different from the first inductor (L1).

In one of the first to tenth aspects, in the high-frequency module (1 or 1A) according to an eleventh aspect, the mounting substrate (9) has a first main surface (91) serving as the main surface (91) and a second main surface (92) opposite from the first main surface (91). The high-frequency module (1 or 1A) further includes an external connection terminal (8), and another component (for example, the second switch 5 or the third switch 6). The external connection terminal (8) is located on the second main surface (92) of the mounting substrate (9). The other component is a component different from the first inductor (L1), the second inductor (L2), and the high-frequency component (2). The first inductor (L1), the second inductor (L2), and the high-frequency component (2) are located on the first main surface (91) side of the mounting substrate (9). The other component is located on the second main surface (92) side of the mounting substrate (9).

According to this aspect, the high-frequency module (1 or 1A) may be downsized.

In the eleventh aspect, in the high-frequency module (1 or 1A) according to a twelfth aspect, the other component is an IC chip (34) including at least a low-noise amplifier (21). The high-frequency component (2) is the reception filter (22A or 22B) or the duplexer (32A or 32B). The reception filter (22A or 22B) allows the reception signal from the antenna (310) to pass therethrough. The duplexer (32A or 32B) includes both of the reception filter (22A or 22B) and the transmission filter (12A or 12B). The transmission filter (12A or 12B) allows the transmission signal to the antenna (310) to pass therethrough. The IC chip (34) overlaps with at least part of the high-frequency component (2) in the depth direction (D1) of the mounting substrate (9).

According to this aspect, a path from the high-frequency component (2) to the IC chip (34) may be shortened.

In one of the first to twelfth aspects, in the high-frequency module (1 or 1A) according to a thirteenth aspect, the conductive member (20) is electrically connected to the ground with a through-hole electrode (323), a side electrode (324), or a conductive wire (30) interposed therebetween. The through-hole electrode (323) penetrates through the high-frequency component (2) in a depth direction of the high-frequency component (2). The side electrode (324) is disposed over the side surface of the high-frequency component (2).

According to this aspect, the coupling between the first inductor (L1) and the second inductor (L2) may be restrained further.

A communication apparatus (300) according to a fourteenth aspect includes the high-frequency module (1 or 1A) in one of the first to thirteenth aspects and a signal processing circuit (301). The signal processing circuit (301) processes the reception signal from the antenna (310) and the transmission signal to the antenna (310).

According to this aspect, with the conductive member (20) electrically connected to the shield layer (103), the coupling between the first inductor (L1) and the second inductor (L2) may be diminished. In addition, since the conductive member (20) is connected to the main surface (321) of the high-frequency component (2), the layout area of the mounting substrate (9) may be ensured as compared with the case where the conductive member (20) is connected to the mounting substrate (9) having the high-frequency component (2) mounted thereon. That is, according to this aspect, the coupling between the first inductor (L1) and the second inductor (L2) may be restrained, and the layout area of the mounting substrate (9) may also be ensured.

1, 1A high-frequency module
2 high-frequency component
4 first switch
5 second switch
6 third switch
8 external connection terminal
9 mounting substrate
11 power amplifier
12A, 12B transmission filter
13 output matching circuit
14 controller
20 conductive member
21 low-noise amplifier
22A, 22B, 221 to 224 reception filter
23, 24A to 24D input matching circuit
32A, 32B duplexer
34 IC chip
40 common terminal
41, 42 selective terminal
48 input unit
50 common terminal
51, 52 selective terminal
58 input unit
60 common terminal
61, 62 selective terminal
68 input unit
71A, 71B, 72A to 72D matching circuit
81 antenna terminal
82 input terminal
83 output terminal
84 control terminal
91 first main surface (main surface)
92 second main surface
93 outer side-surrounding surface
101 first resin layer
102 second resin layer
103 shield layer
131 inductor (first matching inductor)
148 terminal
201 conductive wire
202 conductive pillar
203 metal block
231, 241 to 244 inductor (second matching inductor)
300 communication apparatus
301 signal processing circuit
302 RF signal processing circuit
303 baseband-signal processing circuit
310 antenna
321 first main surface (main surface)
322 second main surface
323 through-hole electrode
324 side electrode
711, 712, 721 to 724 inductor (third matching inductor)

1011 main surface
1013 outer side-surrounding surface
1023 outer side-surrounding surface
D1 depth direction of mounting substrate
H1 height of high-frequency component
H2 height of first inductor
H3 height of second inductor
L1 first inductor
L2 second inductor
LN1 to LN18 line
P1 to P14, P21 to P36 point
R1 to R5, R11 to R14 region
T1 transmission path
T11 first transmission path
T12 second transmission path
T2 reception path
T21 first reception path
T22 second reception path

The invention claimed is:

1. A high-frequency module comprising:
a mounting substrate having a main surface;
a first inductor located on a main surface side of the mounting substrate facing the main surface;
a second inductor located on the main surface side of the mounting substrate;
at least one high-frequency component located on the main surface side of the mounting substrate and between the first inductor and the second inductor;
a shield layer connected to ground; and
a conductive member connecting the high-frequency component and the shield layer,
wherein the conductive member is connected to a main surface of the high-frequency component, the main surface of the high-frequency component facing the shield layer,
wherein in a depth direction of the mounting substrate, a height of the high-frequency component is lower than at least one of a height of the first inductor and a height of the second inductor.

2. The high-frequency module according to claim 1, wherein the conductive member includes a conductive wire.

3. The high-frequency module according to claim 2, wherein the at least one high-frequency component comprises a plurality of high-frequency components, and wherein the conductive wire is connected to the plurality of high-frequency components.

4. The high-frequency module according to claim 3, wherein the conductive member includes a conductive pillar.

5. The high-frequency module according to claim 3, wherein the conductive member includes a metal block.

6. The high-frequency module according to claim 2, wherein the conductive member includes a conductive pillar.

7. The high-frequency module according to claim 2, wherein the conductive member includes a metal block.

8. The high-frequency module according to claim 1, wherein the conductive member includes a conductive pillar.

9. The high-frequency module according to claim 8, wherein the conductive member includes a metal block.

10. The high-frequency module according to claim 1, wherein the conductive member includes a metal block.

11. The high-frequency module according to claim 1, wherein in the depth direction of the mounting substrate, the height of the high-frequency component is lower than each of the height of the first inductor and the height of the second inductor.

12. The high-frequency module according to claim 1, further comprising:
a resin layer disposed between the high-frequency component and the shield layer.

13. The high-frequency module according to claim 1, wherein the high-frequency component is
a reception filter allowing a reception signal from an antenna to pass through the reception filter,
a transmission filter allowing a transmission signal to the antenna to pass through the transmission filter, or
a duplexer including both of the reception filter and the transmission filter.

14. The high-frequency module according to claim 1, wherein the first inductor is
a first matching inductor disposed on a signal path between the high-frequency component and a power amplifier, the power amplifier amplifying a transmission signal to an antenna,
a second matching inductor disposed on a signal path between the high-frequency component and a low-noise amplifier, the low-noise amplifier amplifying a reception signal from the antenna, or
a third matching inductor disposed on a signal path between the high-frequency component and the antenna, and
wherein the second inductor is the first matching inductor, the second matching inductor, or the third matching inductor and is different from the first inductor.

15. The high-frequency module according to claim 1, wherein the mounting substrate has a first main surface serving as the main surface of the mounting substrate and a second main surface opposite from the first main surface, and
the high-frequency module further comprises an external connection terminal located on the second main surface of the mounting substrate,
wherein the high-frequency module further comprises another component different from the first inductor, the second inductor, and the high-frequency component,
wherein the first inductor, the second inductor, and the high-frequency component are located on a first main surface side of the mounting substrate, and
wherein the other component is located on a second main surface side of the mounting substrate facing the second main surface.

16. The high-frequency module according to claim 15, wherein the other component is an IC chip including at least a low-noise amplifier,
wherein the high-frequency component is
the reception filter allowing a reception signal from an antenna to pass through the reception filter, or the duplexer including both of the reception filter and the transmission filter allowing a transmission signal to the antenna to pass through the transmission filter, and
wherein the IC chip overlaps with at least part of the high-frequency component in the depth direction of the mounting substrate.

17. The high-frequency module according to claim 1, wherein the conductive member is electrically connected to the ground with a through-hole electrode, a side electrode, or a conductive wire interposed between the ground and the through-hole electrode, the side electrode, or the conductive wire, the through-hole electrode penetrating through the high-frequency component in a depth direction of the high-frequency component, the side electrode being disposed over a side surface of the high-frequency component.

18. A communication apparatus comprising:
the high-frequency module according to claim 1; and
a signal processing circuit processing a reception signal from an antenna and a transmission signal to the antenna.

* * * * *